(12) United States Patent
Abdel-Salam et al.

(10) Patent No.: US 11,781,775 B2
(45) Date of Patent: Oct. 10, 2023

(54) HYBRID DIRECT AND INDIRECT AIR COOLING SYSTEM

(71) Applicant: Nortek Air Solutions Canada, Inc., Saskatoon (CA)

(72) Inventors: Ahmed Hamdi Abdel-Salam, Saskatoon (CA); Philip Paul LePoudre, Saskatoon (CA); Manfred Gerber, Saskatoon (CA)

(73) Assignee: Nortek Air Solutions Canada, Inc., Saskatoon (CA)

( * ) Notice: Subject to any disclaimer, the term of this patent is extended or adjusted under 35 U.S.C. 154(b) by 382 days.

(21) Appl. No.: 16/645,342

(22) PCT Filed: Sep. 7, 2018

(86) PCT No.: PCT/CA2018/051094
§ 371 (c)(1),
(2) Date: Mar. 6, 2020

(87) PCT Pub. No.: WO2019/046956
PCT Pub. Date: Mar. 14, 2019

(65) Prior Publication Data
US 2020/0284464 A1    Sep. 10, 2020

Related U.S. Application Data

(60) Provisional application No. 62/556,250, filed on Sep. 8, 2017.

(51) Int. Cl.
*F24F 11/81* (2018.01)
*F24F 5/00* (2006.01)
(Continued)

(52) U.S. Cl.
CPC .............. *F24F 11/81* (2018.01); *F24F 5/0035* (2013.01); *F24F 11/65* (2018.01); *F24F 11/83* (2018.01);
(Continued)

(58) Field of Classification Search
CPC .......... F24F 11/81; F24F 5/0035; F24F 11/65; F24F 11/83; F24F 13/06; F24F 13/10;
(Continued)

(56) References Cited

U.S. PATENT DOCUMENTS 5,970,723 A    10/1999    Kinkel et al.
6,253,559 B1    7/2001    Kinkel et al.
(Continued)

FOREIGN PATENT DOCUMENTS

CN    202254035    5/2012
CN    203116208    8/2013
(Continued)

OTHER PUBLICATIONS

"International Application Serial No. PCT/CA2018/051094, International Search Report dated Nov. 30, 2018", 3 pgs.
(Continued)

*Primary Examiner* — Nelson J Nieves
*Assistant Examiner* — Matthew John Moscola
(74) *Attorney, Agent, or Firm* — Schwegman Lundberg & Woessner, P.A.

(57) ABSTRACT

A hybrid system and method for conditioning air for an enclosed space can include a direct cooling system in combination with an indirect cooling system. The hybrid system can use direct cooling when ambient temperature and humidity levels are such that 100% outdoor air can be delivered to the enclosed space. The hybrid system can use indirect cooling when 100% of the return air can be conditioned using an external cooling unit and then returned to the
(Continued)

enclosed space as supply air. The external cooling unit can include an evaporative cooler and operate in a dry mode and a wet mode. The external cooling unit can produce a reduced temperature cooling fluid and provide liquid cooling to the air when the system is operating in the indirect mode, and in some cases, in the direct mode. The hybrid system can operate in a mixed mode in which the external cooling unit is off and a mix of return air and outdoor air can be delivered to the enclosed space.

28 Claims, 10 Drawing Sheets

(51) Int. Cl.

| | | |
|---|---|---|
| *F24F 11/65* | (2018.01) | |
| *F24F 11/83* | (2018.01) | |
| *F24F 13/06* | (2006.01) | |
| *F24F 13/10* | (2006.01) | |
| *F24F 13/30* | (2006.01) | |
| *F24F 11/58* | (2018.01) | |
| *F24F 13/28* | (2006.01) | |
| *H05K 7/20* | (2006.01) | |
| *F24F 110/22* | (2018.01) | |
| *F24F 110/12* | (2018.01) | |

(52) U.S. Cl.
CPC ............. *F24F 13/06* (2013.01); *F24F 13/10* (2013.01); *F24F 13/30* (2013.01); *F24F 11/58* (2018.01); *F24F 13/28* (2013.01); *F24F 2110/12* (2018.01); *F24F 2110/22* (2018.01); *H05K 7/20745* (2013.01)

(58) Field of Classification Search
CPC .. F24F 13/30; F24F 11/58; F24F 13/28; F24F 2110/12; F24F 2110/22; F24F 5/0003; F24F 12/002; F24F 3/06; F24F 3/044; H05K 7/20745; Y02B 30/54; Y02B 30/56
See application file for complete search history.

(56) References Cited

U.S. PATENT DOCUMENTS

| 6,311,511 | B1 | 11/2001 | Maeda |
| 6,367,277 | B1 | 4/2002 | Kinkel et al. |
| 8,469,782 | B1 | 6/2013 | Roy |
| 8,578,726 | B2 | 11/2013 | Hay |
| 9,121,618 | B2 | 9/2015 | Fisher et al. |
| 9,313,929 | B1 | 4/2016 | Malone et al. |
| 2003/0037905 | A1 | 2/2003 | Weng |
| 2012/0298334 | A1 | 11/2012 | Madaffari et al. |
| 2013/0056177 | A1 | 3/2013 | Coutu et al. |
| 2013/0320573 | A1* | 12/2013 | Fisher ................. F25D 17/06 261/127 |
| 2014/0069127 | A1 | 2/2014 | Bailey et al. |
| 2014/0063730 | A1 | 3/2014 | Hay |
| 2014/0260369 | A1* | 9/2014 | LePoudre ............ F24F 5/0035 62/314 |
| 2015/0369527 | A1* | 12/2015 | Ghadiri Moghaddam ................ F24F 3/1423 62/305 |
| 2016/0198593 | A1* | 7/2016 | Schmitt ............. H05K 7/20745 361/679.49 |
| 2018/0014434 | A1* | 1/2018 | Craft, Jr ............... H05K 7/2079 |
| 2018/0128510 | A1* | 5/2018 | LePoudre .............. F24F 12/00 |
| 2019/0113247 | A1* | 4/2019 | LePoudre .......... H05K 7/20827 |
| 2020/0096212 | A1* | 3/2020 | LePoudre ............ F24F 11/0001 |
| 2021/0239333 | A1* | 8/2021 | LePoudre ............ F24F 3/1417 |

FOREIGN PATENT DOCUMENTS

| CN | 103827595 | 5/2014 |
| CN | 104541108 | 4/2015 |
| CN | 105164484 | 12/2015 |
| CN | 205383723 | 7/2016 |
| CN | 107208910 | 9/2017 |
| CN | 109073265 | 12/2018 |
| CN | 111194390 | 5/2020 |
| CN | 111194390 B | 12/2021 |
| WO | WO-2016207864 A1 | 12/2016 |
| WO | WO-2019046956 A1 | 3/2019 |

OTHER PUBLICATIONS

"International Application Serial No. PCT/CA2018/051094, Written Opinion dated Nov. 30, 2018", 4 pgs.

El-Dessouky, H T, et al., "A Novel air conditioning system Membrane Air Drying and Evaporative Cooling", Institution of Chemical Engineers—Trans IChemE, vol. 78, Part A, Oct. 2000, (Oct. 2000), 999-1009.

Khattar Ph.D., Mukesh K., "Honorable Mention Industrial Facilities, New Free Cooling Data Center", Ashare Journal ashare.org Oct. 2014, (Oct. 4, 2014), 60-69.

"European Application Serial No. 18853427.5, Extended European Search Report dated May 4, 2021", 9 pages.

"Chinese Application Serial No. 201880065345.1, Response filed Jul. 26, 2021 to Office Action dated Jan. 11, 2021", with English claims, 14 pages.

"International Application Serial No. PCT/CA2018/051094, International Preliminary Report on Patentability dated Mar. 19, 2020", 6 pgs.

"European Application Serial No. 18853427.5, Response to Communication Pursuant to Rules 161 and 162 filed Nov. 4, 2020", 15 pgs.

"Chinese Application Serial No. 201880065345.1, Office Action dated Jan. 11, 2021", w/ English Translation, 23 pgs.

* cited by examiner

HYBRID DIRECT AND INDIRECT AIR COOLING SYSTEM

CLAIM OF PRIORITY

This application is a U.S. National Stage Filing under 35 U.S.C. § 371 of International Patent Application Serial No. PCT/CA2018/051094, filed Sep. 7, 2018, and published on Mar. 14, 2019, as WO 2019/046956 A1, which claims the benefit of U.S. Provisional Patent Application Ser. No. 62/556,250, filed on Sep. 8, 2017, the benefit of priority of which is claimed hereby, and which are both incorporated by reference herein in their entirety.

BACKGROUND

There are many applications where cooling is critical, such as, for example, data centers. A data center usually consists of computers and associated components working continuously (24 hours per day, 7 days per week). The electrical components in a data center can produce a lot of heat, which then needs to be removed from the space. Air-conditioning systems in data centers can often consume more than 40% of the total energy.

With the current data centers' air-conditioning systems and techniques and significant improvements in IT components operating conditions and processing capacity, servers can roughly operate at 50% of their capacity. This capacity limitation is due, in part, to the cooling systems not being able to cool the servers efficiently and the servers reach their high temperature limit before reaching their maximum capacity. High density data center cooling seeks to cool servers more effectively and increase the density of the data centers. Consequently, this can result in savings in data center operating costs and increase the overall capacity of the data center.

Existing cooling systems for data centers and other enclosed spaces can include direct-air and indirect-air cooling technologies. Each of these technologies (direct-air and indirect-air) can have drawbacks or limitations, depending on the operating conditions. Such drawbacks or limitations can include, for example, increased water or energy consumption or decreased indoor air quality.

OVERVIEW

The present inventors recognize, among other things, an opportunity for improved performance in cooling an enclosed space using a hybrid system capable of direct and indirect cooling in combination. Thus the hybrid system can integrate the strengths of direct and indirect cooling technologies. The system can operate under a plurality of operating modes and a particular operating mode can be selected based on the outdoor air conditions. As shown below, the systems and methods disclosed herein can result in a reduced Water Usage Effectiveness (WUE) and a reduced partial Power Usage Effectiveness (pPUE) as compared to other existing designs.

Indirect cooling can be achieved by using liquid cooling technologies to reject the heat at the server. Data center liquid cooling affects the data center energy consumption in two ways: (1) utilizing maximum server processing capacity and data center processing density which will result in lower cooling power consumption per kW of processing power in the data center, and (2) generally liquid-cooling systems are more energy efficient than data centers air-cooling systems. The liquid cooling technology can capture up to 100% of the heat at the server which can eliminate the need for data centers air-cooling systems. The data center liquid cooling can save up to 90% in data centers cooling costs and up to 50% in data centers operating costs. Also, data center liquid cooling can increase the servers processing density by up to 100%, which can result in significant savings.

An external cooling unit, which can be physically separate from the enclosed space and the accompanying air handling unit, can be used to produce a reduced temperature cooling fluid. The reduced temperature cooling fluid can provide liquid cooling to a heat load from the enclosed space. In an example, the reduced temperature cooling fluid can be delivered to a plenum or air handling unit to cool return air from the enclosed space. In an example, the reduced temperature cooling fluid can be water. In an example, the reduced temperature cooling fluid can reduce a temperature of a second cooling fluid and the second cooling fluid can be delivered to the plenum or air handling unit to cool the return air.

The external cooling unit can include an evaporative cooler and one or more additional components that enable the external cooling unit to operate in a dry mode and a wet mode. In an example, the evaporative cooler of the cooling unit can include a Liquid-to-Air Membrane Energy Exchanger (LAMEE) operating as an evaporative cooler.

The direct mode can be achieved under certain ambient conditions in which the external cooling unit can be on or off and the outdoor air can be delivered to the enclosed space as supply air. In a mixed mode, the cooling unit can be off and a combination of outdoor air and return air can be delivered as supply air to the enclosed space.

Examples according to the present application can include a control system for operating the hybrid system in multiple modes depending at least in part on ambient temperature and humidity. The operating modes can include 100% indirect in which the return air from the enclosed space is cooled using the reduced temperature cooling fluid from the external cooling unit. The operating modes can include 100% direct in which the outdoor air conditions are sufficient such that the external cooling unit is off and the outdoor air can be delivered to the enclosed space as supply air. Hot return air from the enclosed space can be exhausted to outside. The operating modes can include 100% direct with the cooling unit on. The outdoor air can be within an acceptable humidity range and the cooling unit can be used to reduce a temperature of the outdoor air before the outdoor air is delivered to the enclosed space. In a mixed operating mode, the external cooling unit can be off, a portion of the return air from the enclosed space can be supplied back to the enclosed space and a portion of the return air can be exhausted to outside. In the mixed operating mode, the supply air to the enclosed space can also include outdoor air.

Examples according to the present application can include multiple sub-modes for 100% indirect operation, including operating the external cooling unit in a dry mode and a wet mode. In the dry mode, the evaporative cooler of the external cooling unit can be bypassed and water can be conserved. The wet mode can include multiple sub-modes, such as, adiabatic, evaporative and super-evaporative.

This overview is intended to provide an overview of subject matter in the present application. It is not intended to provide an exclusive or exhaustive explanation of the invention. The detailed description is included to provide further information about the present application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present application relates to systems and methods to condition air for an enclosed space using a direct and indirect hybrid cooling system. The hybrid system is able to leverage the advantages of each type of cooling system—direct cooling and indirect cooling, while minimizing or eliminating the disadvantages of each. In an example, the enclosed space can be a data center.

The hybrid system can use indirect cooling when 100% of the hot return air can be conditioned using an external cooling unit and the conditioned air can be returned to the enclosed space. The external cooling unit can include multiple components and can operate in multiple modes (or sub modes) including a dry mode and a wet mode. The hybrid system can operate in a direct mode when ambient temperature and humidity levels are such that 100% outdoor air can be delivered to the data center. For the direct mode, the outdoor air quality should be acceptable for the enclosed space. The direct mode can include a first direct mode with 100% outdoor air and the external cooling unit off (direct without cooling), such that the temperature and humidity of the outdoor air is acceptable. The direct mode can include a second direct mode with 100% outdoor air and the external cooling unit on (direct with cooling). In such mode, the humidity level of the outdoor air can be within an acceptable range for delivery of the outdoor air to the enclosed space, but a temperature of the outdoor air can be higher than an acceptable range. As such, the external cooling unit can be used to reduce a temperature of the outdoor air. The hybrid system can operate in a mixed mode in which the external cooling unit is off and a mix of hot return air and outdoor air can be delivered to the enclosed space.

Figure 1:
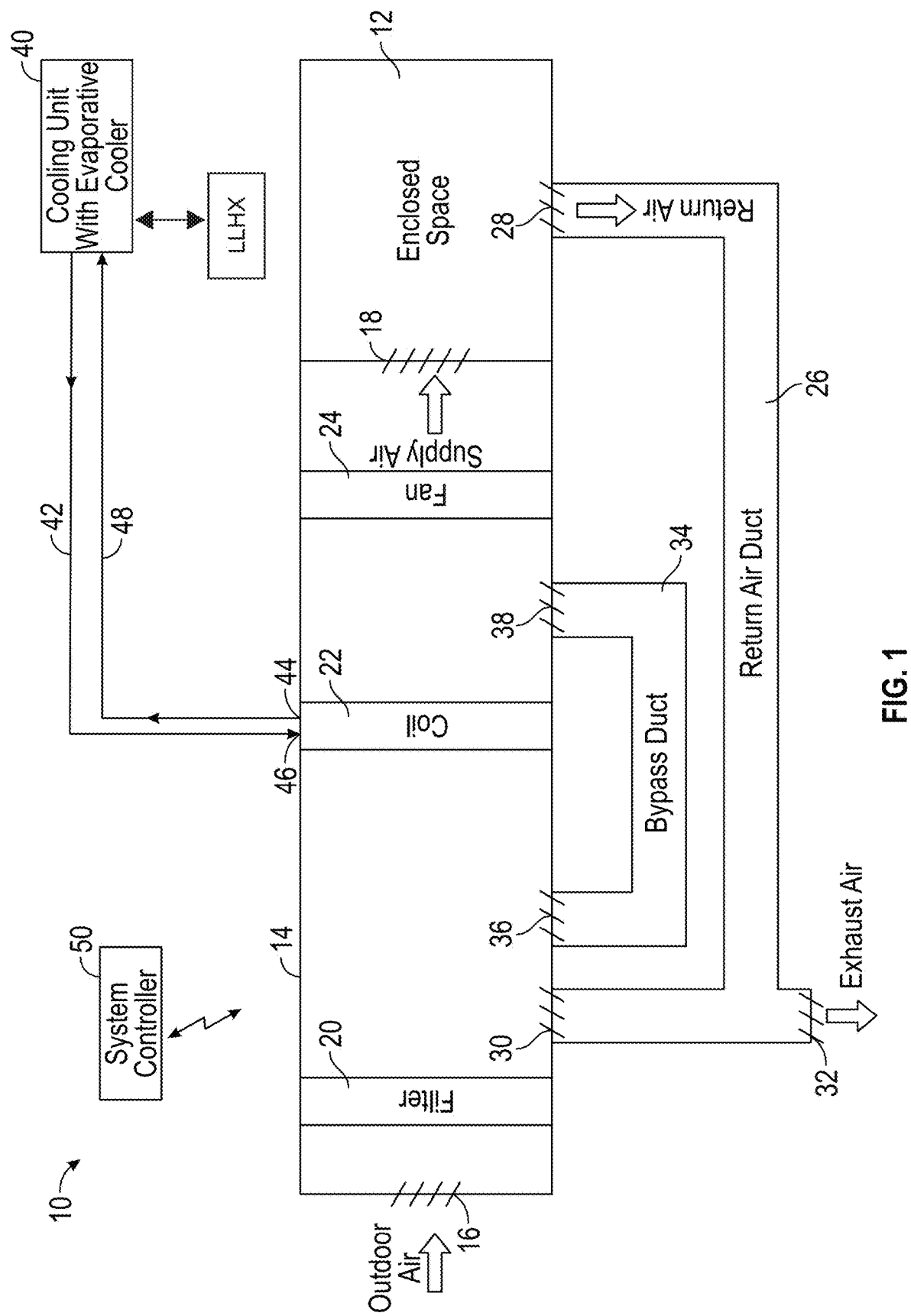
FIG. 1 is a schematic of an example hybrid cooling system, in accordance with the present application, for providing cooling to an enclosed space.

FIG. 1 is a schematic of a hybrid system 10 to condition air for an enclosed space 12. The system 10 can include a plenum 14 having an outdoor air inlet 16 and a supply air outlet 18. The plenum 14 can be configured to deliver an air stream through at least a portion of the plenum 14 and deliver supply air to the enclosed space 12 through the supply air outlet 18. The plenum 14 can also be referred to as a housing, cabinet, structure or air handling unit and can be configured to house one or more components used to condition air or water.

The hybrid system 10 can include a filter 20, a coil 22, and a fan 24, all of which can be disposed inside the plenum 14. The filter 20 can be configured to remove contaminants from the outdoor air entering the plenum 14 through the outdoor air inlet 16. The fan 24 can be configured to deliver the supply air from the plenum 14 to the enclosed space 12 through the supply air outlet 18. The fan 24 can be a single fan or multiple fans, including a fan array, such as, for example, FANWALL® Systems provided by Nortek Air Solutions.

The hybrid system 10 can include a return air duct 26 that can be configured to selectively deliver return air from the enclosed space (via an outlet 28) to at least one of the plenum 14 (to be used as supply air) through a return air inlet 30 and to outside (as exhaust air) through an exhaust air outlet 32. If the hybrid system 10 is operating, regardless of the mode, the outlet 28 can be open; the operating mode can determine whether one or both of the return air inlet 30 and the exhaust air outlet 32 are open.

In an example, the hybrid system 10 can include a bypass duct 34 having a bypass inlet 36 and a bypass outlet 38. As described below, the bypass duct 34 can be used in a direct mode (without cooling) or a mixed mode to divert air from the plenum 14 and bypass the coil 22. Bypassing the coil 22 can eliminate a pressure drop that results from the air stream passing through the coil 22, even if the coil 22 is not operational. In other examples, the hybrid system 10 can exclude the bypass duct 34. In an example, even if the bypass duct 34 is included in the system 10, in a direct mode with cooling (see FIG. 1B) or mixed mode (FIG. 1D) the outdoor air can pass through the coil 22 to cool the outdoor air before the outdoor air is delivered to the enclosed space as supply air.

The hybrid system 10 can include a cooling unit 40 which can be located external to the plenum 14 and the enclosed space 12. The cooling unit 40 can include one or more components that can be selectively used in combination to produce a reduced temperature cooling fluid. The reduced temperature cooling fluid can selectively provide liquid cooling to the air flowing through the plenum 14. As described below, depending on an operating mode of the system 10, the cooling unit 40 can be off during some ambient conditions even though the system 10 is operating and air is flowing through the plenum 14 for delivery to the enclosed space 12.

The reduced temperature cooling fluid from the cooling unit 40 can be delivered to the coil 22 via a supply line 42. The reduced temperature cooling fluid can flow through the coil 22 and thus cool the air flowing through the coil 22. As such, a temperature of the cooling fluid at an outlet 44 of the coil 22 can be higher than a temperature of the cooling fluid at an inlet 46 of the coil 22. The increased temperature cooling fluid can be delivered back to the cooling unit 40 via a return line 48 and recirculated back through the cooling unit 40 to again reduce the temperature of the cooling fluid. In an example, the cooling fluid can be water or predominantly water. It is recognized that other types of evaporative cooling fluids can be used in combination with water or as an alternative to water for use as the cooling fluid circulating through the cooling unit 40 and the coil 22.

In an example, the reduced temperature cooling fluid exiting the cooling unit 40 can circulate through the coil 22. In another example, the reduced temperature cooling fluid from the unit 40 can cool a second fluid and the second fluid can pass through the coil 22. This is described further below in reference to FIG. 4A. Although not included in FIG. 1, the system 10 can include a liquid to liquid heat exchanger (LLHX) that can circulate the reduced temperature cooling fluid from the cooling unit 40 and the second fluid.

Figure 4A:
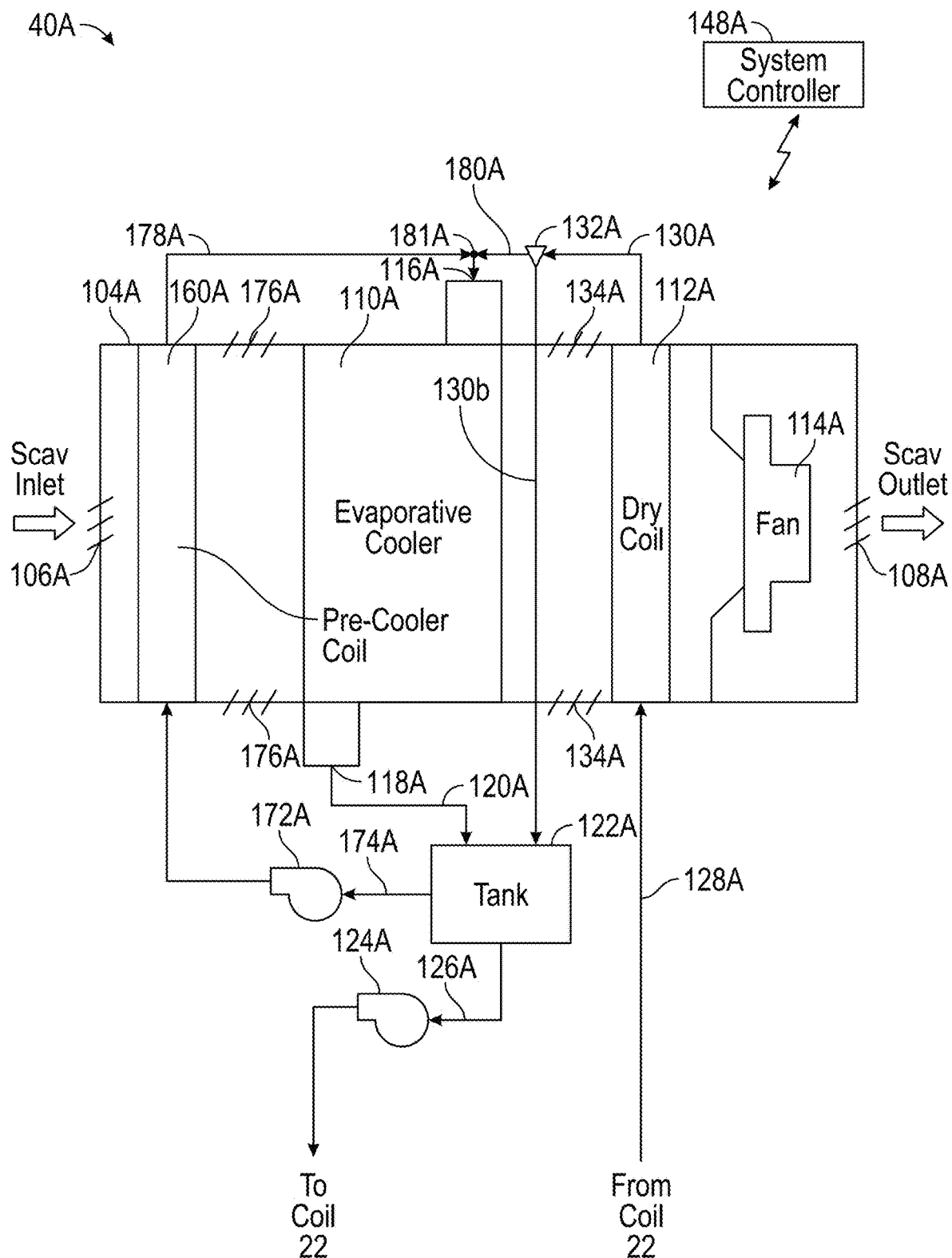
FIG. 4A is a schematic of an example cooling unit, in accordance with the present application, for use within the hybrid system of FIG. 1.
Figure 4B:
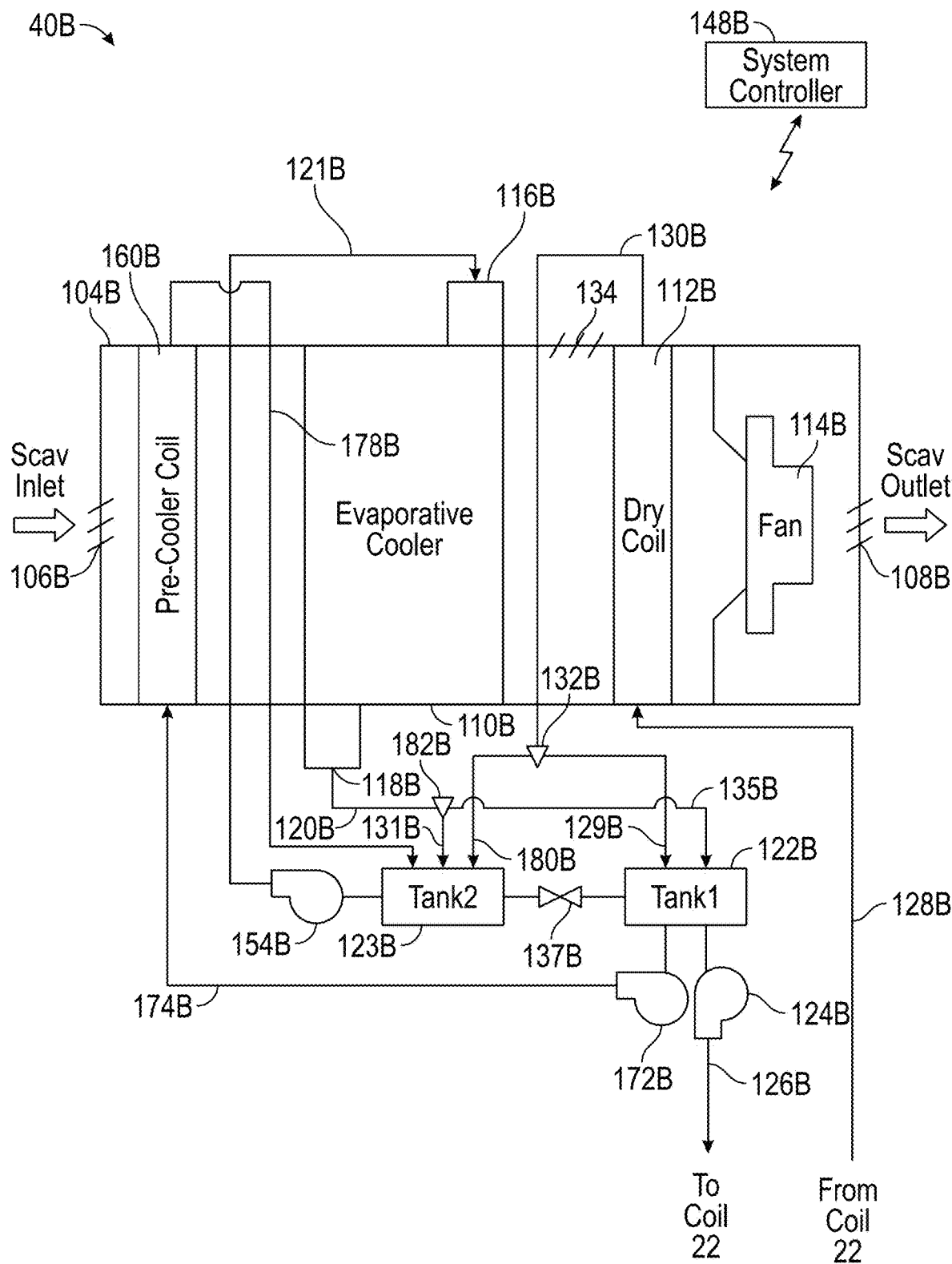
FIG. 4B is a schematic of an example cooling unit, in accordance with the present application, for use within the hybrid system of FIG. 1.

In an example, the cooling unit 40 can use scavenger air (outdoor air) that can selectively pass through the one or more components of the cooling unit 40 and reduce a temperature of the cooling fluid flowing there through. During operation in an indirect mode, the reduced temperature cooling fluid flows through the coil 22 in the plenum 14. Thus, the indirect mode of the hybrid system 10 can be described as an air-to-liquid-to air cooling system. The cooling unit 40 can include an evaporative cooler and can operate in multiple modes, including a dry mode and a wet mode. Because the cooling unit 40 can use outdoor scavenger air to reduce a temperature of the cooling fluid, an operating mode of the cooling unit 40 can depend on ambient temperature and humidity, as described further below. In the dry mode, the evaporative cooler of the cooling unit 40 can be bypassed and a temperature of the cooling fluid can be reduced using the scavenger air stream passing through the cooling unit 40. The wet mode can include multiple sub-modes, such as for example, an adiabatic mode, an evaporative mode, and a super-evaporative mode. Examples of a design and configuration of the cooling unit 40 is shown in FIGS. 4A and 4B and described below.

The hybrid system 10 can include a system controller 50 to control operation of the system 10. The controller 50 can be used to determine an operating mode of the system 10 and vary the operating mode as needed and desired. The controller 50 can be manual or automated, or a combination of both. The controller 50 is described further below in reference to the controller 148A of FIG. 4A.

Figure 5:
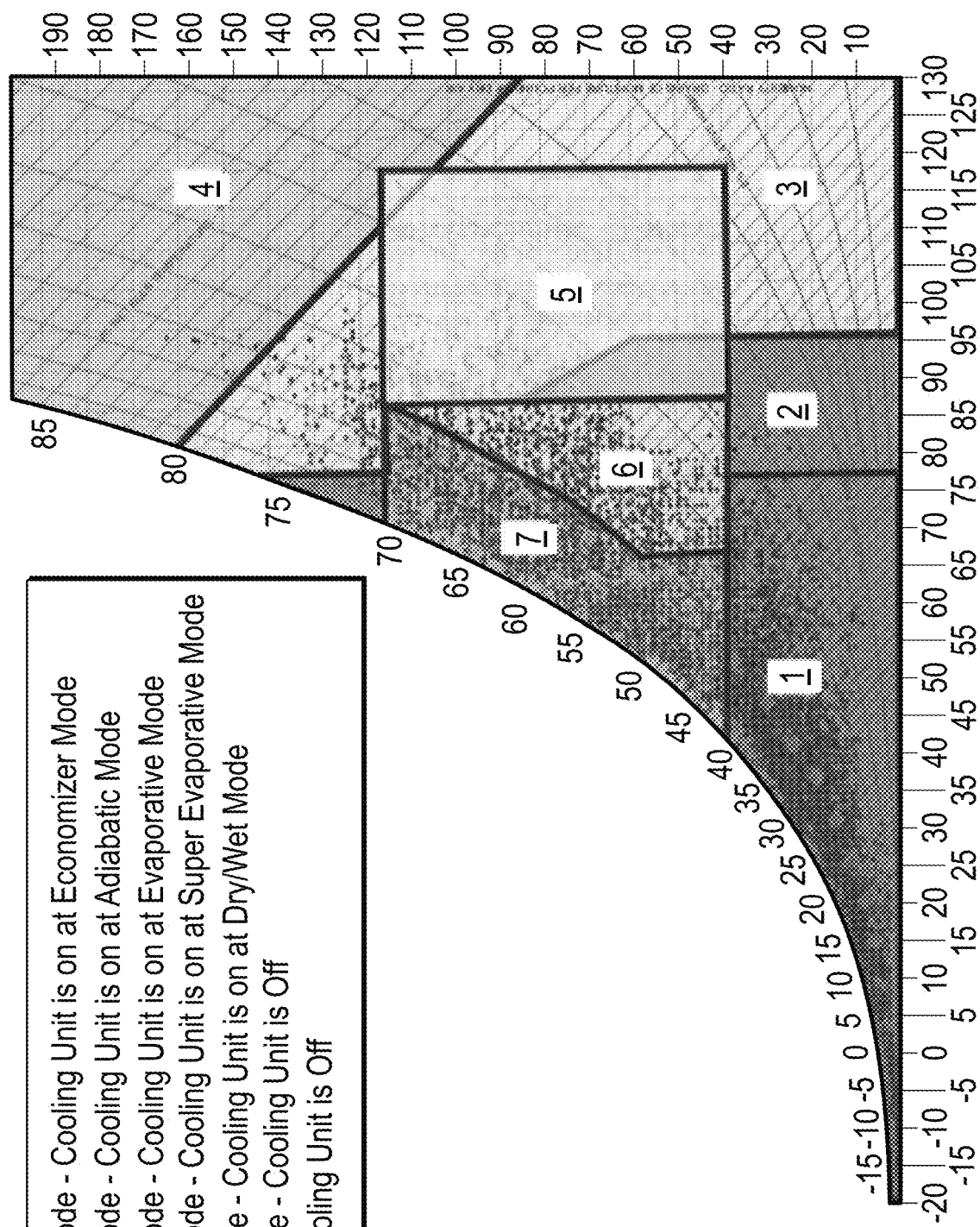
FIG. 5 is a psychometric chart illustrating various operating modes of the hybrid system, in accordance with the present application.
Figure 6:
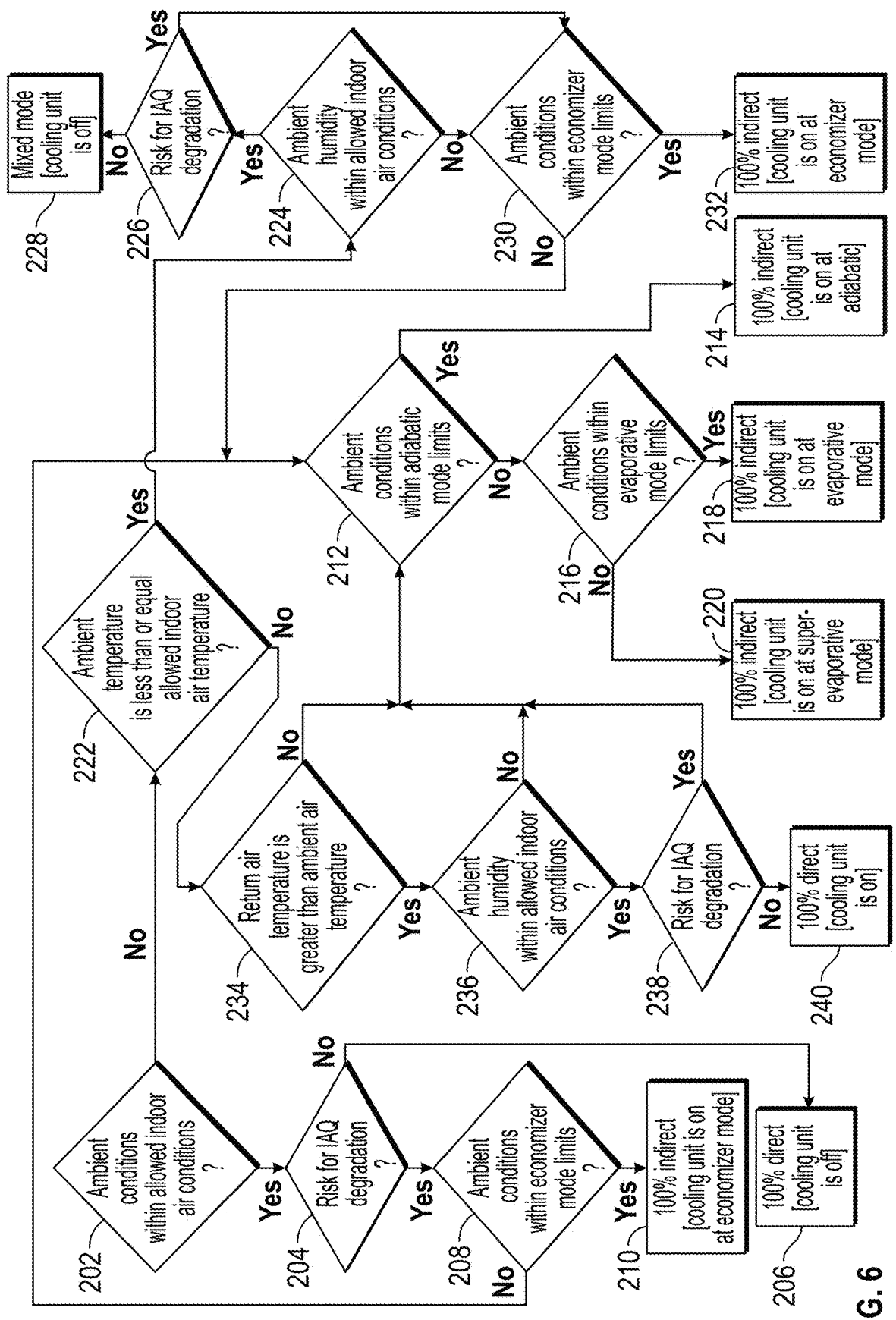
FIG. 6 is a flow chart of an example process for determining an operating mode of the hybrid system, in accordance with the present application.

FIGS. 1A-1D illustrate air flow through the system 10 in the indirect, direct and mixed modes of operation and aid in the description below of how such air flow varies as a function of the operating mode of the system 10. FIGS. 5 and 6 and the accompanying description below illustrate how the operating mode can be determined.

Figure 1A:
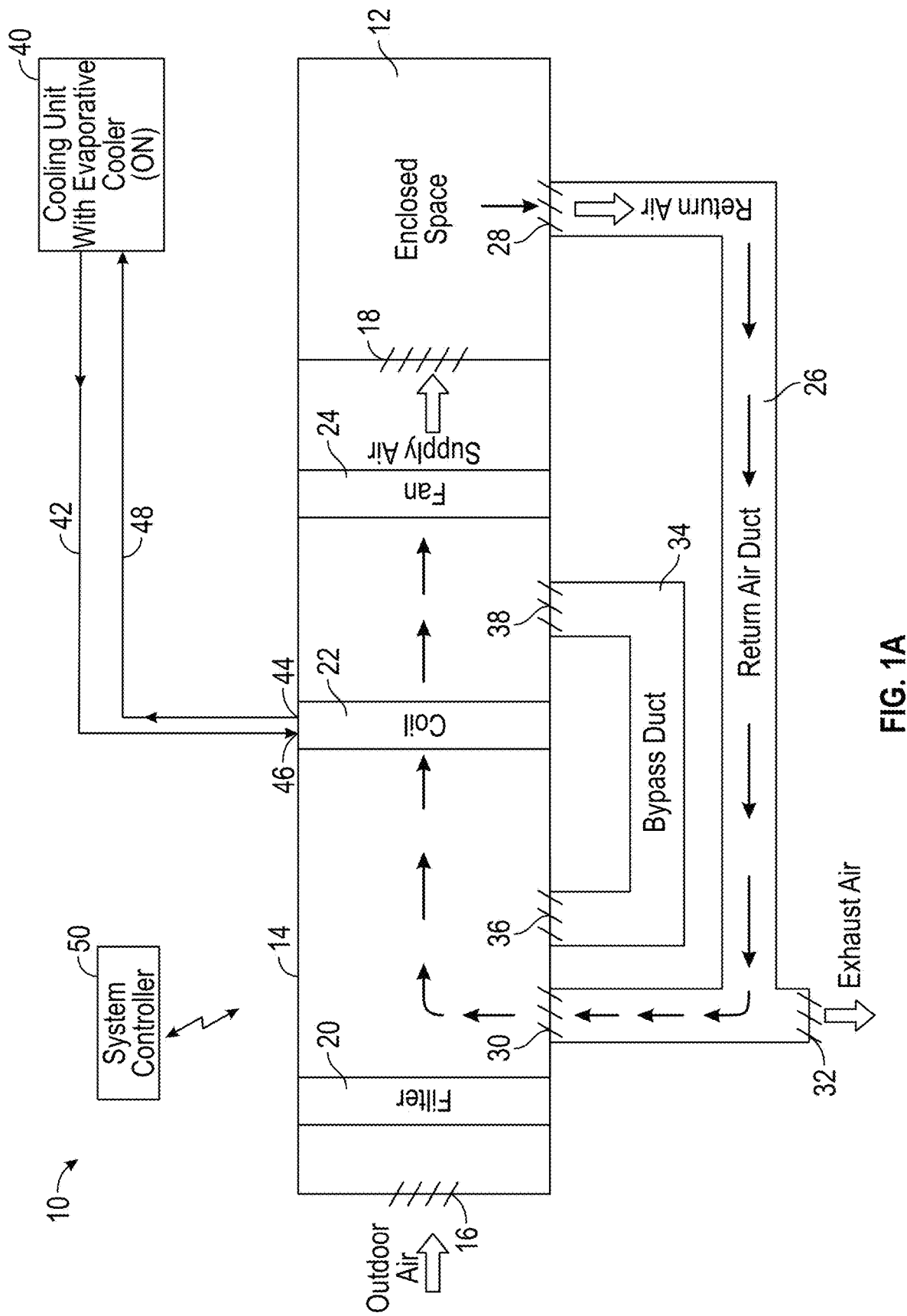
FIG. 1A is a schematic of the hybrid cooling system of FIG. 1 operating in an indirect mode.

FIG. 1A illustrates air flow (designated as arrows) in an indirect mode in which essentially 100% of the supply air delivered to the enclosed space 12 (via the supply air outlet 18) can be return air from the enclosed space that is indirectly cooled inside the plenum 14. In the indirect mode, the outlet 28 and return air inlet 30 can be open, and supply air from the enclosed space 12 can flow through the return air duct 26 and into the plenum 14 at a location upstream of the filter 20. In the indirect mode, the exhaust air outlet 32 can be closed such that essentially all of the return air in the return air duct can flow into the plenum 14. The outdoor air inlet 16 can also be closed.

During the indirect mode, the cooling unit 40 can be on and reduced temperature cooling fluid can be supplied to the coil 22. As the air flows through the coil 22, the reduced temperature cooling fluid flowing through the coil 22 can reduce a temperature of the air in the plenum 14. The fan 24 can then direct the reduced temperature air back to the enclosed space 12 as supply air.

In an example, the return air inlet 30 can be located downstream of the filter 20. As such, in the indirect or mixed modes, the return air passing through the plenum 14 can avoid any pressure drop associated with passing through the filter 20. The filter 20 can be arranged inside the plenum 14 such that the outdoor air passes through the filter 20 but any return air does not. Although not shown in FIG. 1 or FIG. 1A, it is recognized that the system 10 can include a make-up air unit to introduce fresh air into the enclosed space 12 when the system 10 is operating in the 100% indirect mode.

Figure 1B:
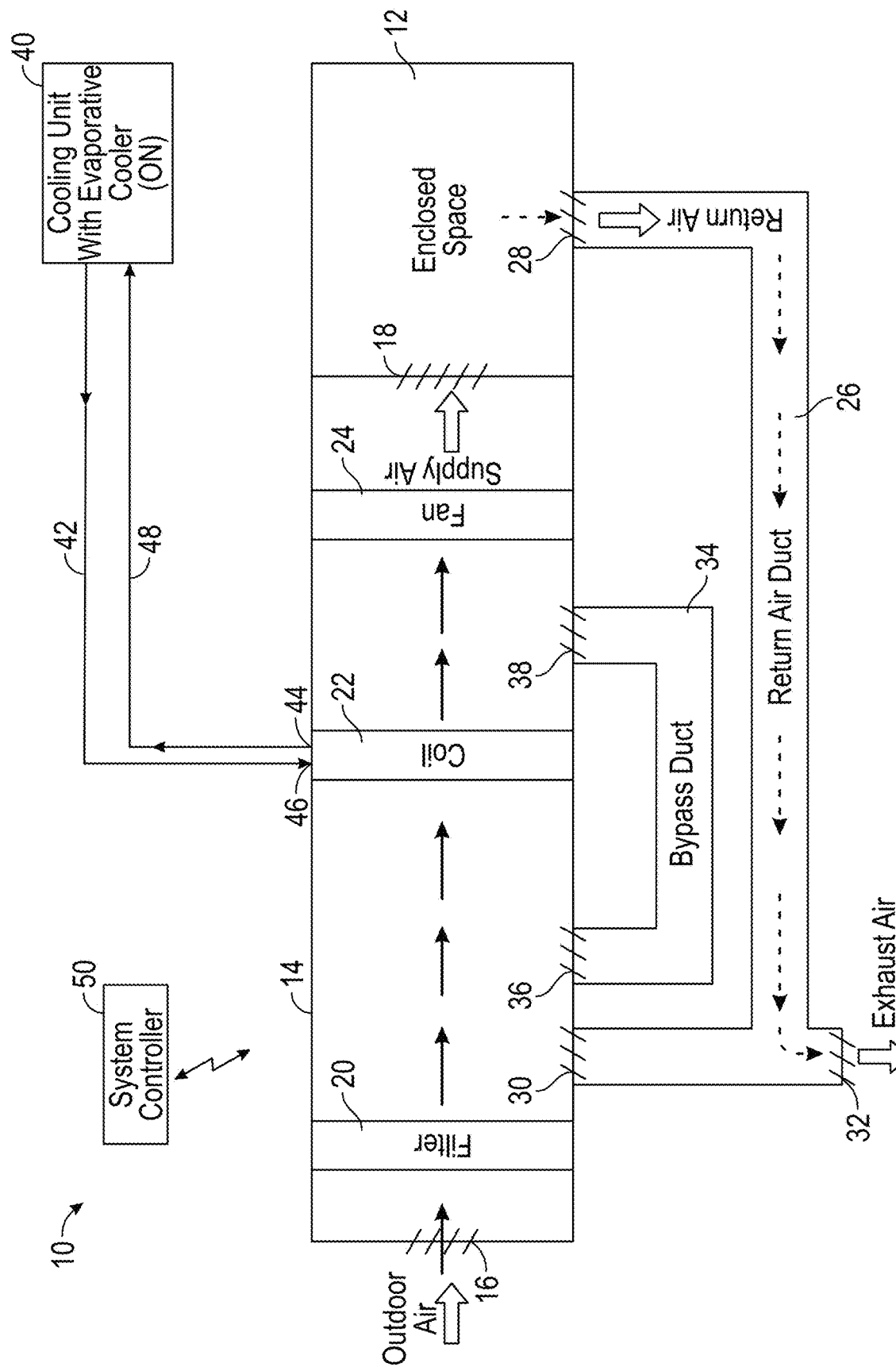
FIG. 1B is a schematic of the hybrid cooling system of FIG. 1 operating in a direct mode with cooling from an external cooling unit.

FIG. 1B illustrates air flow (designated as arrows) in a direct mode with cooling. In this mode (direct with cooling), essentially 100% of the supply air delivered to the enclosed space 12 can be outdoor air. The outdoor air inlet 16 can be open and the return air inlet 30 can be closed. As a result of the inlet 30 being closed, all of the return air exiting the enclosed space 12 and flowing through the return air duct 26 can exit the duct 26 as exhaust air through the exhaust air outlet 32. In this mode (direct with cooling), the outdoor air conditions are such that the outdoor air is within an acceptable humidity range for delivery to the enclosed space but the outdoor air requires some cooling to reduce a temperature of the outdoor air before delivery to the enclosed space. As shown in FIG. 1B, the outdoor air can thus be passed through the coil 22 and the reduced temperature cooling fluid circulating through the coil 22 can reduce the temperature of the outdoor air.

Figure 1C:
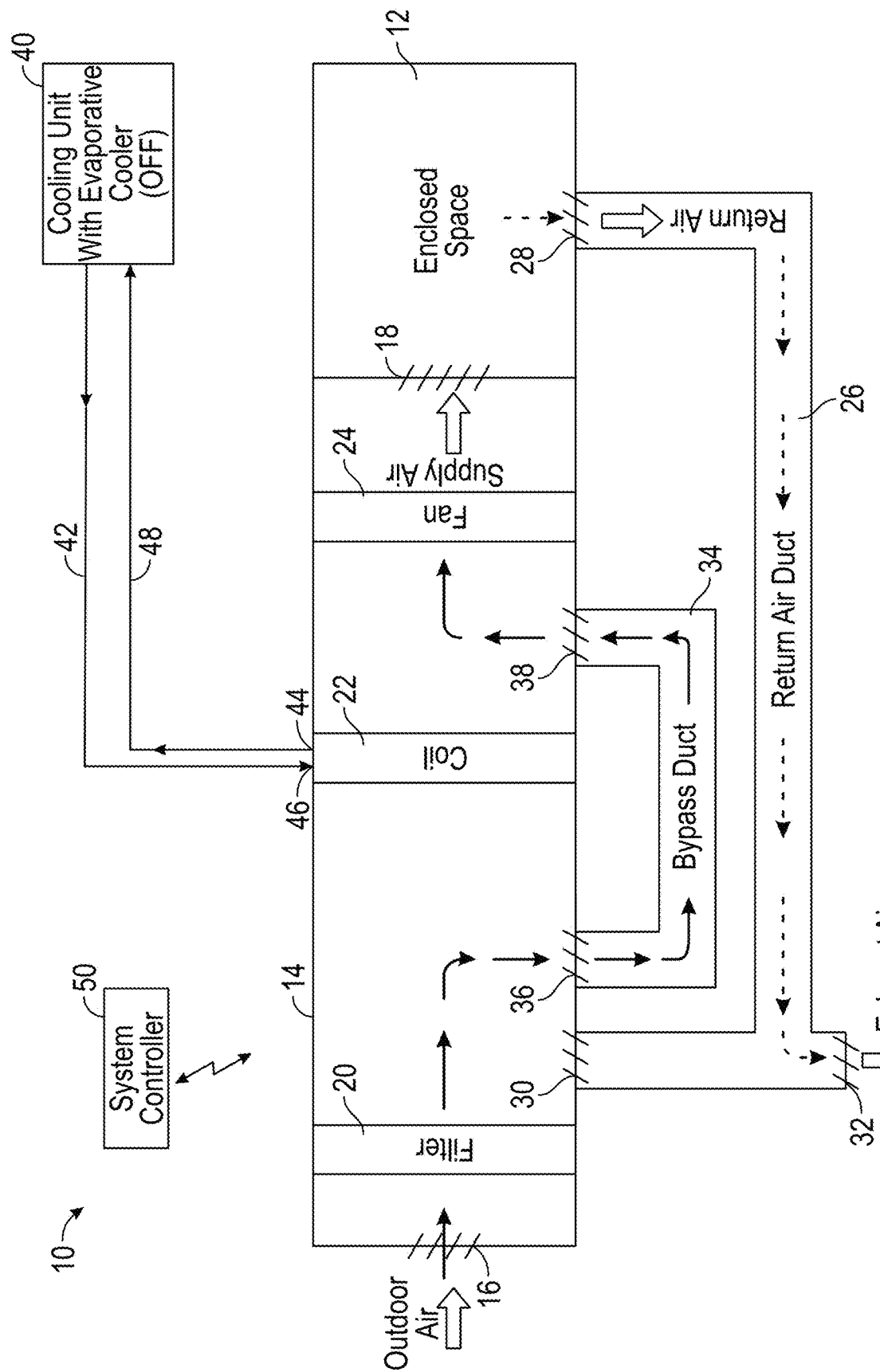
FIG. 1C is a schematic of the hybrid cooling system of FIG. 1 operating in a direct mode without any cooling from the external cooling unit.

FIG. 1C illustrates air flow (designed as arrows) in a direct mode without cooling in which essentially 100% of the supply air delivered to the enclosed space 12 can be outdoor air. In this mode (direct without cooling), the cooling unit 40 and the coil 22 can be off (or non-operational) and the outdoor air can be delivered to the enclosed space 12 without having to cool or adjust a humidity of the outdoor air. The mode represented in FIG. 1C is referred to herein as "direct without cooling" because the external cooling unit 40 is off/not operating and the coil 22 is off/not operating (i.e. not circulating the reduced temperature cooling fluid from the cooling unit 40); however, in this mode, it is recognized that the enclosed space is being directly cooled with the outdoor air.

In an example, the system 10 can include the bypass duct 34, which can divert the outdoor air, after it passes through the filter 20, through the bypass inlet 36 such that the outdoor air bypasses the coil 22. The bypass outlet 38 can be located downstream of the coil 22 and upstream of the fan 24. In an example, the system 10 can exclude the bypass duct and the outdoor air can flow through the coil 22, even though the coil 22 can be off (non-operational) in the direct without cooling mode. After bypassing the coil 22 or passing through the non-operational coil 22, the outdoor air can be directed into the enclosed space 12 via the fan 24 and the supply air outlet 18.

In either the direct with cooling mode (FIG. 1B) and the direct without cooling mode (FIG. 1C), as well as the mixed mode (see FIG. 1D), the outdoor air conditions are such that the outdoor air can be delivered to the enclosed space 12. In an example, the outdoor air can pass through the filter 20 to remove contaminants from the outdoor air. Operation in the direct or mixed modes can be contingent on acceptable air quality of the outdoor air. If the outdoor air quality is poor, the system 10 can switch to the indirect mode shown in FIG. 1A.

Figure 1D:
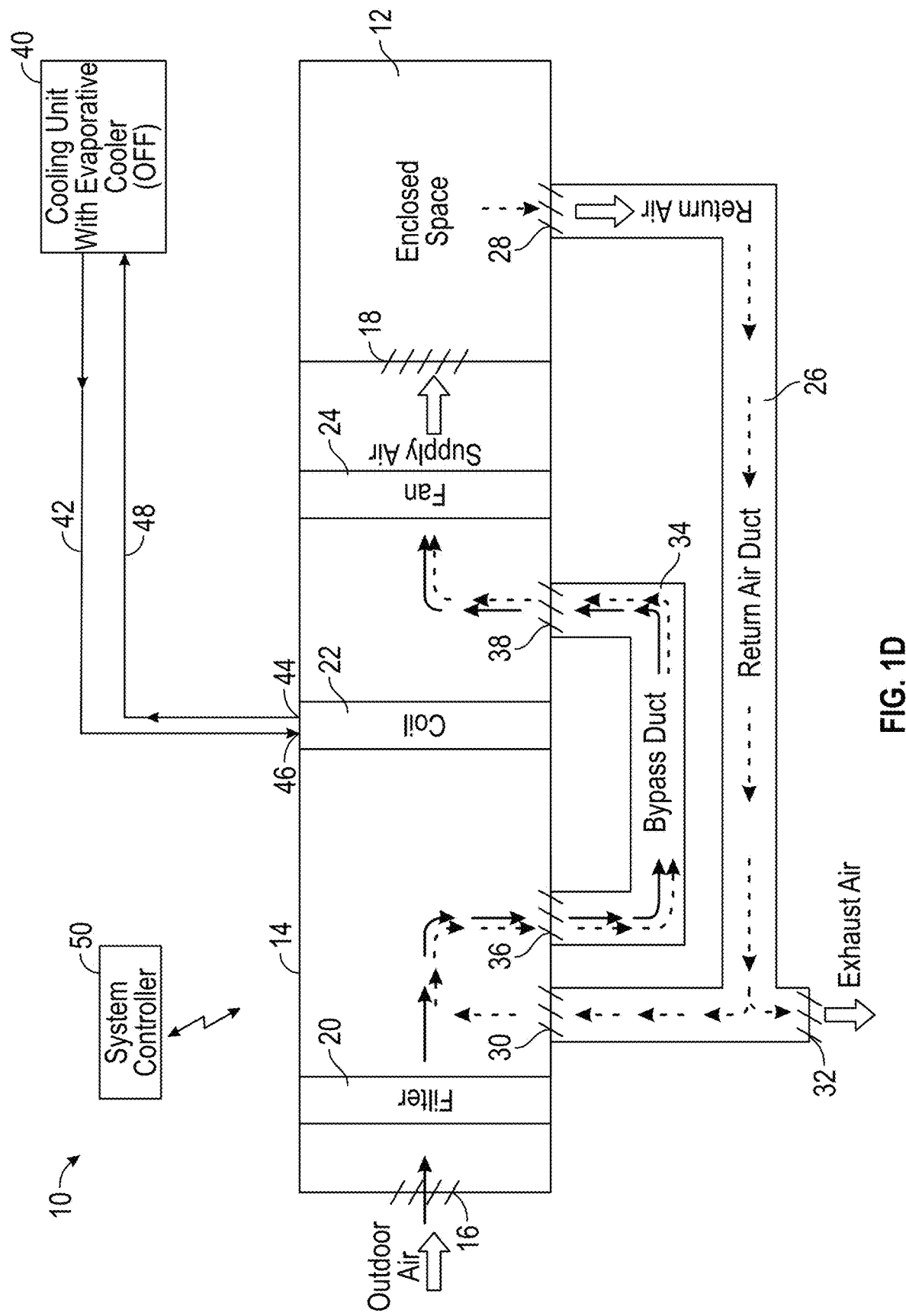
FIG. 1D is a schematic of the hybrid cooling system of FIG. 1 operating in a mixed mode.

FIG. 1D illustrates air flow (designated as arrows) in a mixed mode in which the cooling unit 40 and coil 22 are off, and a combination of outdoor air and return air can be delivered to the enclosed space 12. In the mixed mode, both the return air inlet 30 and the exhaust air outlet 32 can be open such that the return air in the return air duct 26 can be split into two portions—a first portion can enter the plenum through the return air 30 and a remaining portion (or a second portion) can be exhausted through the exhaust air outlet 32. The first portion of return air entering the plenum can mix with outdoor air entering the plenum through the outdoor air inlet 16. In the mixed mode, the coil 22 can be off and consequently there is no cooling fluid running through the coil 22. The mixed air stream of outdoor air and return air can either pass through the non-operational coil 22 or the mixed air stream can flow through the bypass duct 26. The controller 50 of the system 10 can determine and vary the amount of return air in the mixed air stream relative to the amount of outdoor air in the mixed air stream.

The modes of operation for the system 10 are shown in FIGS. 1A-1D. In an example, the cooling unit 40 can be on in the 100% indirect mode and the direct with cooling mode. There can be multiple sub-modes of indirect cooling, which are described below in reference to FIGS. 4A and 4B. (These sub-modes can also be used in the direct with cooling mode.) The specific type and number of sub-modes under the indirect mode can depend, at least in part, on the type and arrangement of the components in the cooling unit 40.

The cooling unit 40 can be described as being off when the system 10 is operating in the direct without cooling mode or the mixed mode, mainly because the reduced temperature cooling fluid is not circulating through the coil 22 when the system 10 is operating in these two modes. However, it is recognized that even if the system 10 is operating in one of these two modes, in an example, the cooling unit 40 can be on or operational and the reduced temperature cooling fluid produced by the cooling unit 40 can be stored in a reserve for future cooling of the air stream passing through the coil 22. Thus, the "on" and "off" (or operational/non-operational) designation herein for the cooling unit 40 can refer to whether the coil 22 is receiving reduced temperature cooling fluid (from the cooling unit 40 or from a reserve or supply of cooling fluid) for circulating through the coil 22 to cool the air stream.

In an example, the configuration or layout of the hybrid system 10 can be based on or originate from an indirect cooling system that uses air-to-liquid-to-air cooling of return air from an enclosed space. As provided above, liquid cooling can provide significant advantages. Such indirect cooling system can be modified structurally such that it has the functionality to also provide direct cooling and operate as a hybrid system. The strengths of a direct cooling system can be leveraged with an existing indirect system. An intake damper for outdoor air (i.e. the outdoor air inlet 16) can be added to the plenum or air handling unit 14 for the return air so that the plenum 14 can direct outdoor through the plenum 14 and into the enclosed space 12, either in combination with or as an alternative to the return air. An exhaust damper for return air (i.e. the exhaust air outlet 32) can be added to the return air duct 26 to discharge some or all of the return air when operating in a direct or mixed mode. Existing indirect systems can be retrofit with these additional components in order to operate as a hybrid system.

It is recognized that additional components, such as, for example, a filter, can be included inside or external to the plenum 14. In an example, a side-stream filtration unit can be included in the system 10 so that a portion of the air in the enclosed space 12 can be continuously or selectively filtered.

As described above, the hybrid system 10 can leverage the strengths of direct and indirect cooling. By being able to switch back and forth between the various operating modes, the hybrid system 10 can minimize or eliminate the disadvantages or limitations of each of the direct and indirect cooling systems. A comparison was conducted to demonstrate potential energy and water savings of the hybrid system 10 as compared to existing cooling technologies. The various cooling systems that were evaluated are shown below in Table 1 and the evaluation was conducted in the state of Iowa (United States) which can have a challenging climate (a dry winter and a humid summer).

TABLE 1

Comparison of Hybrid System to existing technologies

| Technology | Description | Exemplary commercial design |
|---|---|---|
| 1 | Hybrid system disclosed herein | |
| 2 | Indirect-air cooling system with liquid cooling - Nortek Air Solutions | |
| 3 | Indirect-air cooling system - Nortek Air Solutions | Nortek Air Solutions Cool3 IDEC |

Figure 2:
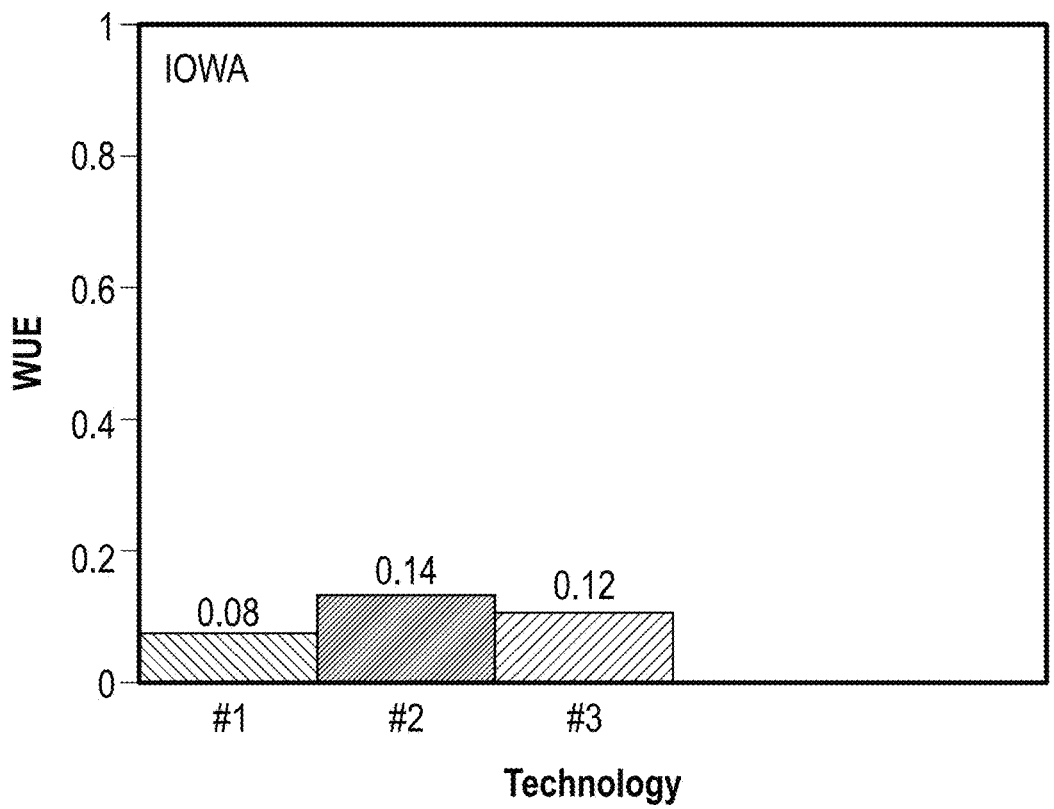
FIG. 2 is a chart comparing the Water Usage Effectiveness (WUE) of the hybrid system disclosed herein to existing technologies.

FIG. 2 compares a Water Usage Effectiveness (WUE) of the hybrid system (#1) to technologies #2 and #3. As shown in FIG. 2, the hybrid system demonstrated the lowest water usage.

Figure 3:
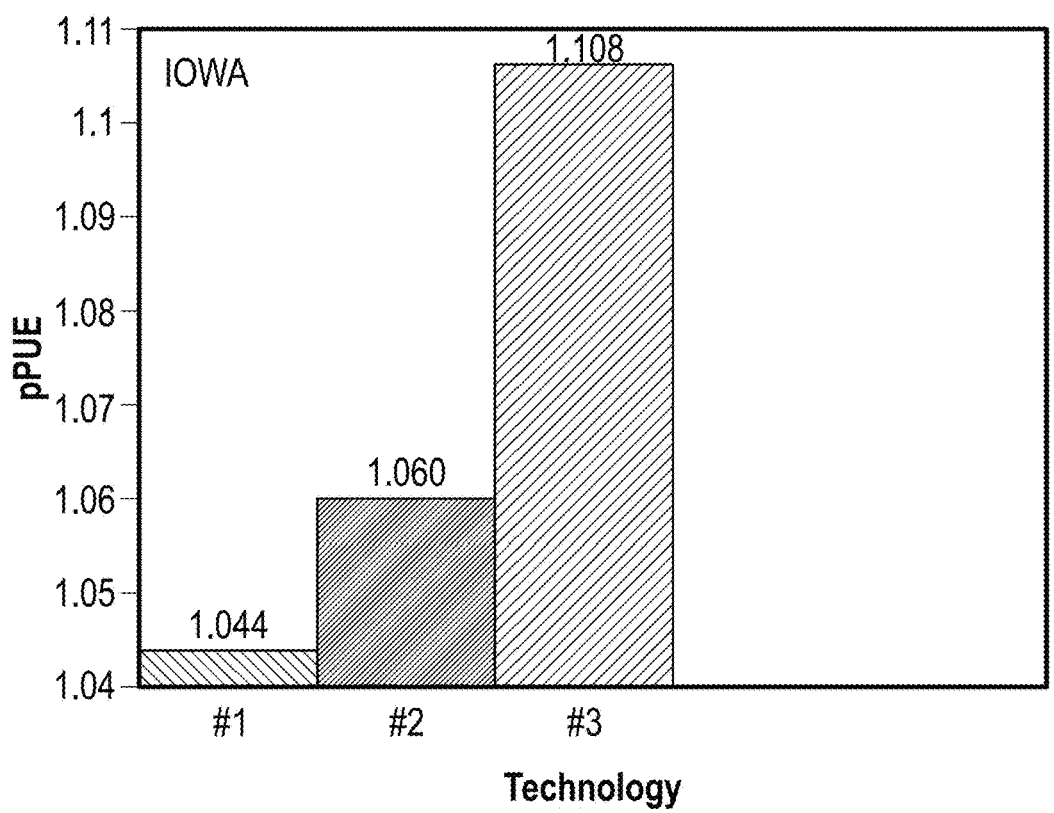
FIG. 3 is a chart comparing the partial Power Usage Effectiveness (pPUE) of the hybrid system disclosed herein to existing technologies.

FIG. 3 compares a partial Power Usage Effectiveness (pPUE) of the hybrid system (#1) to technologies #2 and #3. The hybrid system demonstrated the lowest power usage relative to technologies #2 and #3.

Referring back to FIG. 1, the external cooling unit 40 of the hybrid system 10 can operate in multiple modes to provide multiple sub-modes of indirect cooling. The cooling unit 40 can include an evaporate cooler in combination with one or more other additional components that enable the cooling unit to operate in a dry mode and a wet mode. A particular operating mode of the external cooling unit 40 can be selected based on the outdoor air conditions (temperature and humidity).

FIGS. 4A and 4B illustrate examples of a cooling unit 40A and 40B, respectively, suitable for use as the external cooling unit 40 in the hybrid system 10 of FIG. 1. The cooling unit 40A of FIG. 4A can enable three sub-modes of indirect cooling for the hybrid system 10. The cooling unit 40B of FIG. 4B can enable four sub-modes of indirect cooling for the hybrid system 10.

FIG. 4A illustrates an example cooling unit 40A for providing cooling to the enclosed space 12 via the coil 22 (see FIG. 1). The cooling unit 40A can include a scavenger air plenum 104A which can include an air inlet 106A and an air outlet 108A through which a scavenger air stream can flow. The plenum 104A can also be referred to as a housing, cabinet or structure, and can be configured to house one or more components used to condition air or water. The plenum 104A can be disposed outside of the enclosed space 12 and the plenum 14.

The cooling unit 40A can include a pre-cooler 160A, an evaporative cooler 110A, a dry coil (or cooling coil) 112A, and a fan (or fan array) 114A, all of which can be arranged inside the plenum 104A. The dry coil or cooling coil 112A can also be referred to herein as a recovery coil. The pre-cooler 160A can also be referred to herein as a pre-cooling coil, a pre-cooler coil, a pre-conditioner or a dry coil. The pre-cooler 160A can be referred to herein as a first cooling component (upstream of the evaporative cooler 110A) and the dry coil 112A can be referred to herein as a second cooling component (downstream of the evaporative cooler 110A). In some examples, a filter (not shown) can be arranged inside the scavenger plenum 104A near the air inlet 106A.

The scavenger air entering the plenum 104A can pass through a pre-cooler 160A to precondition the scavenger air. The pre-cooler 160A is discussed further below. The scavenger air exiting the pre-cooler 160A can then pass through the evaporative cooler 110A. The evaporative cooler 110A can be configured to condition the scavenger air passing there through using an evaporative fluid, such as water. The evaporative cooler 110A can use the cooling potential in both the air and the evaporative fluid to reject heat. In an example, as scavenger air flows through the evaporative cooler 110A, the evaporative fluid, or both the scavenger air and the evaporative fluid, can be cooled to a temperature approaching the wet bulb (WB) temperature of the air leaving the pre-cooler 160A. Due to the evaporative cooling process in the evaporative cooler 110A, a temperature of the evaporative fluid at an outlet 118A of the evaporative cooler 110A can be less than a temperature of the evaporative fluid at an inlet 116A of the evaporative cooler 110A; and a temperature of the scavenger air at an outlet of the evaporative cooler 110A can be less than a temperature of the scavenger air at an inlet of the evaporative cooler 110A. In some cases, a temperature reduction of the evaporative fluid can be significant, whereas in other cases, the temperature reduction can be minimal. Similarly, a temperature reduction of the scavenger air can range between minimal and significant. In some cases, the scavenger air temperature can increase across the evaporative cooler 110A. Such temperature reduction of one or both of the evaporative fluid and the scavenger air can depend in part on the outdoor air conditions (temperature, humidity), operation of the pre-cooler 160A, and operation of the evaporative cooler 110A. For example, as described below and shown in FIG. 4B, in an example, the evaporative cooler 110B can selectively operate adiabatically, in which case a temperature of the evaporative fluid circulating through the evaporative cooler 110B can remain relatively constant or undergo minimal changes.

The evaporative cooler 110A can be any type of evaporative cooler configured to exchange energy between an air stream and a cooling fluid through evaporation of a portion of the fluid into the air. Evaporative coolers can include direct-contact evaporation devices in which the working air stream and the liquid water (or other fluid) stream that is evaporated into the air to drive heat transfer are in direct contact with one another. In what is sometimes referred to as "open" direct-contact evaporation devices, the liquid water may be sprayed or misted directly into the air stream, or, alternatively the water is sprayed onto a filler material or wetted media across which the air stream flows. As the unsaturated air is directly exposed to the liquid water, the water evaporates into the air, and, in some cases, the water is cooled.

Such direct-contact evaporation devices can also include what is sometimes referred to as a closed circuit device. Unlike the open direct-contact evaporative device, the closed system has two separate fluid circuits. One is an external circuit in which water is recirculated on the outside of the second circuit, which is tube bundles (closed coils) connected to the process for the hot fluid being cooled and returned in a closed circuit. Air is drawn through the recirculating water cascading over the outside of the hot tubes, providing evaporative cooling similar to an open circuit. In operation the heat flows from the internal fluid circuit, through the tube walls of the coils, to the external circuit and then by heating of the air and evaporation of some of the water, to the atmosphere.

These different types of evaporative coolers can also be packaged and implemented in specific types of systems. For example, a cooling tower can include an evaporative cooling device such as those described above. A cooling tower is a device that processes working air and water streams in generally a vertical direction and that is designed to reject waste heat to the atmosphere through the cooling of a water stream to a lower temperature. Cooling towers can transport the air stream through the device either through a natural draft or using fans to induce the draft or exhaust of air into the atmosphere. Cooling towers include or incorporate a direct-contact evaporation device/components, as described above.

Examples of evaporative coolers usable in the cooling unit 40 of FIG. 1 can also include other types of evaporative cooling devices, including liquid-to-air membrane energy exchangers. Unlike direct-contact evaporation devices, a liquid-to-air membrane energy exchanger (LAMEE) separates the air stream and the liquid water stream by a permeable membrane, which allows water to evaporate on the liquid water stream side of the membrane and water vapor molecules to permeate through the membrane into the air stream. The water vapor molecules permeated through the membrane saturate the air stream and the associated energy caused by the evaporation is transferred between the liquid water stream and the air stream by the membrane.

Membrane exchangers may have some advantages over other types of evaporative coolers. For example, the LAMEE may eliminate or mitigate maintenance requirements and concerns of conventional cooling towers or other systems including direct-contact evaporation devices, where the water is in direct contact with the air stream that is saturated by the evaporated water. For example, the membrane barriers of the LAMEE inhibit or prohibit the transfer of contaminants and micro-organisms between the air and the liquid stream, as well as inhibiting or prohibiting the transfer of solids between the water and air. The use of a LAMEE as the evaporative cooler in the cooling unit 40A is exemplary. As noted above, depending upon the application and a number of factors, examples according to this disclosure can include any type of evaporative cooler configured to exchange energy between an air stream and a cooling fluid through evaporation of a portion of the fluid into the air.

In an example, as shown in FIG. 4A, the evaporative fluid from the evaporative cooler 110A can be collected and delivered to a tank 122A. In other examples, the evaporative fluid from the evaporative cooler 110A is not collected for cooling the enclosed space. In yet other examples, the cooling unit 40A can be configured to switch between the configuration shown in FIG. 4A (in which the evaporative fluid exiting the evaporative cooler 110A is collected and transported to the tank 122A) and operating the evaporative cooler 110A adiabatically to circulate the evaporative fluid through the evaporative cooler 110A only. This is shown in FIG. 4B and described below.

In an example, the evaporative fluid in the evaporative cooler 110A can be water or predominantly water. In the cooling unit 40A of FIG. 4A, the cooling fluid is described as being water but the inlet 116A and outlet 118A can be described as a cooling fluid inlet and a cooling fluid outlet since a fluid in addition to, or as an alternative to, water can circulate through the evaporative cooler 110A. It is recognized that other types of evaporative cooling fluids can be used in combination with water or as an alternative to water in the cooling unit 40A (or 40B in FIG. 4B).

The dry coil or recovery coil 112A can be arranged inside the plenum 104A downstream of the evaporative cooler 110A. The recovery coil 112A can cool a cooling fluid circulating through the recovery coil 112A using the cooling potential of the scavenger air. The scavenger air exiting the evaporative cooler 110A can be relatively cool and additional sensible heat from the cooling fluid passing through the recovery coil 112A can be rejected into the scavenger air. The recovery coil 112A can produce a reduced-temperature cooling fluid that can provide cooling to the coil 22 (see FIG. 1). The reduced-temperature cooling fluid exiting the recovery coil 112A can flow to the evaporative cooler 110A or to a water tank 122A. The flow path of the cooling fluid to and from the recovery coil 112A is described below. The scavenger air exiting the recovery coil 112A can be directed out of the plenum 104A using the fan 114A and can exit the plenum 104A at the outlet 108A as exhaust.

In an example, the cooling fluid circulating through the recovery coil 112A can be water. In an example, the cooling fluid circulating through the recovery coil 112A can be the same fluid as the evaporative fluid in the evaporative cooler 110A.

As provided above, in an example, the evaporative fluid in the evaporative cooler 110A can be water. In an example, as shown in FIG. 4A, the reduced-temperature water from the outlet 118A of the evaporative cooler 110A can be used to provide cooling to the air passing through the coil 22. The reduced-temperature water can flow from the outlet 118A to the water tank 122A via a water line 120A. Although not shown in FIG. 4A, the water tank 122A can include a make-up valve and a drain valve to maintain the water level and hardness level inside the tank 122A. The water tank 122A can include one or more temperature sensors in or around the water tank 122A to monitor a temperature of the water in the tank 122A. In an example, a control of the cooling unit 40A can be based, in part, on a measured temperature of the water in the tank 122A compared to a set point water temperature. In an example, the set point water temperature can be pre-determined based on cooling needed for the enclosed space 12. In an example, the set point water temperature can vary during operation of the system 10, based in part on operation of the data center or other devices that produce the heat in the enclosed space 12.

The water from the water tank 122A can be pumped with a pump 124A to the coil 22 via a water line 126A. Alternatively, the water from the tank 122A can be pumped to a cold water supply main configured to feed the cold water to the coil 22. The reduced-temperature water can provide cooling to the coil 22 by transporting the water through the coil 22. This design can eliminate the steps of moving hot supply air from the enclosed space 12 through the cooling unit 40A and then back to the enclosed space 12. Rather, the reduced temperature water produced by the unit 40A can be delivered to the coil 22.

After the water provides cooling to the coil 22, the water can be recirculated back through the cooling unit 40A. The water can be at an increased-temperature after providing cooling to the air in the plenum 14 because the rejected heat from the air has been picked up by the water. The increased-temperature water can be transported to the dry coil 112A through a water line 128A. Alternatively, the water can be transported to a hot water return configured to transport the increased-temperature water back to the dry coil 112A. As provided above, the dry coil 112A can cool the water using the scavenger air exiting the evaporative cooler 110A.

The water can exit the dry coil 112A at a reduced temperature through a water line 130A, which can be split, using a bypass valve 132A, into a water line 180A to the evaporative cooler 110A and a water line 129A to the tank 122A. The bypass valve 132A can control how much of the water exiting the dry coil 112A is sent to the evaporative cooler 110A and how much is sent to the tank 122A, depending on an operating mode of the cooling unit 40A.

In an economizer mode, the bypass valve 132A can be open such that all of the water from the dry coil 112A can bypass the evaporative cooler 110A and go directly to the tank 122A. The economizer mode or winter mode can enable the cooling unit 40A to cool the water using the scavenger air and dry coil 112A, without having to run the evaporative cooler 110A. In that situation, there may be no need for evaporation inside the evaporative cooler 110A since the cold outdoor air (scavenger air) can pass through the dry coil 112A and sufficiently cool the water. The dry coil 112A can also be referred to herein as an economizer coil since it can be a primary cooling source for the water in the economizer mode. Three modes of operation are described further below for operating the cooling unit 40A.

In another example, instead of the bypass valve 132A controlling a flow between the evaporative cooler 110A and the tank 122A, the cooling unit 40A can include two separate tanks or two separate tank sections. This is described below in reference to FIG. 4B.

The pre-cooler 160A, located upstream of the evaporative cooler 110A, can be used to pre-condition the scavenger air entering the plenum 104A, prior to passing the scavenger air through the evaporative cooler 110A. The pre-cooler 160A can be effective when the temperature of the water entering the pre-cooler 160A is lower than the outdoor air dry bulb temperature. The pre-cooler 160A can be used in typical summer conditions as well as in extreme summer conditions when the outdoor air is hot and humid. The pre-cooler 160A can depress the outdoor air wet bulb temperature, thus pre-cooling the scavenger air and heating the water. The pre-cooler 160A can provide more cooling potential in the evaporative cooler 110A.

In an example as shown in FIG. 4A, the pre-cooler 160A can use water from the tank 122A to condition the scavenger air. A pump 172A can pump water from the tank 122A to the pre-cooler 160A through a water line 174A. (Thus the reduced temperature water in the tank 122A can leave the tank 122A through two different water lines—line 126A to the coil 22 and line 174A to the pre-cooler 160A.) In other examples, one water line and one pump can be used to deliver water out of the tank 122A and a split valve can be used to control the delivery of water to the coil 22 and to the pre-cooler 160A.

In an example, reduced temperature water is described above as being delivered to the coil 22 for providing liquid cooling to the air for the enclosed space 12. FIG. 4A shows the line 126A being directed to the coil 22 for delivery of the water to the coil 22 and the line 128A being directed from the coil 22 for return of the water from the coil 22 to the dry coil 112A. In other examples, instead of delivering water from the tank 122A to the coil 22, the reduced temperature water can be delivered to a liquid to liquid heat exchanger (LLHX) to use the water to reduce a temperature of a secondary coolant circulating through the LLHX. The secondary coolant can then be directed through a supply line to the coil 22 to provide cooling to the coil 22, and the coolant can receive the heat rejected from the air in the plenum 14, resulting in a temperature increase of the secondary coolant. The reduced temperature water can provide cooling to the increased temperature secondary coolant such that the secondary coolant can be delivered back to the coil 22 (via a return line from the coil 22) for continued cooling. Reference is made to International Application No. PCT/CA2016/050252, filed on Mar. 8, 2016, which is incorporated by reference herein and discloses an example of a design with a secondary coolant and LLHX.

Because the pre-cooler 160A uses water from the tank 122A as the cooling fluid in the pre-cooler 160A, the design of the pre-cooler 160A as shown in FIG. 4A can be referred to herein as a coupled pre-cooler. In other words, the pre-cooler 160A is designed and configured to use a portion of the reduced-temperature water produced by the recovery coil 112A or the evaporative cooler 110A (and intended for cooling the air from the enclosed space 12) as the cooling fluid for the pre-cooler 160A. In other examples illustrated and described herein, a cooling fluid circuit for the pre-cooler 160A can be partially or wholly decoupled from the process circuit for the evaporative cooler 110A and recovery coil 112A. In that case, the pre-cooler 160A can have an external cooling circuit partially or wholly separate from the reduced-temperature water produced by the evaporative cooler 110A or recovery coil 112A for process cooling.

In an example, and as shown in FIG. 4A, the plenum 104A can include two sets of bypass dampers—first dampers 176A between the pre-cooler 160A and the evaporative cooler 110A, and second dampers 134A between the evaporative cooler 110A and the dry coil 112A. The use of the bypass dampers 176A and 134A to direct the flow of scavenger air into the plenum 104A can depend on the outdoor air conditions. Although the first and second bypass dampers 176A and 134A are each shown as having a pair of dampers on opposing sides of the plenum 104A, it is recognized that one or both of the first 176A and second 134A bypass dampers can be a single damper on one side of the plenum 104A.

The cooling unit 40A can operate in at least three modes and selection of the mode can depend, in part, on the outdoor air conditions and the heat load of the enclosed space 12. When the outdoor air is cold, the cooling unit 40A can operate in a first mode, also referred to as an economizer mode, and the pre-cooler 160A and the evaporative cooler 110A can be bypassed. The scavenger air can enter the plenum 104A through the dampers A134 and pass through the dry coil 112A. This can protect the evaporative cooler 110A and avoid running the evaporative cooler 110A when it is not needed. In the first mode or economizer mode, the scavenger air can be cool enough such that the dry coil 112A can provide all cooling to the cooling fluid (water) delivered to the tank 122A to provide cooling to the enclosed space 12, without needing to operate the evaporative cooler 110A.

In a second operating mode, which can also be referred to as a normal mode or an evaporation mode, the pre-cooler 160A can be bypassed but the evaporative cooler 110A can be used. The evaporation mode can operate during mild conditions, such as spring or fall, when the temperature or humidity is moderate, as well as during some summer conditions. The scavenger air may be able to bypass the pre-cooler 160A, while still meeting the cooling load. The scavenger air can enter the plenum 104A through dampers 176A, and then can pass through the evaporative cooler 110A and the dry coil 112A. The cooling unit 40A can modulate between a normal mode and an economizer mode to limit power consumption and based on outdoor air conditions. In another example, the dampers 176A can be excluded from unit 40A or the dampers 176A may not be used in some cases. In such example, during the second operating mode, the scavenger air can enter through the inlet 106A and pass through the pre-cooler 160A but the pre-cooler 160A can be turned off such that the water or cooling fluid is not circulating through the pre-cooler 160A.

In a third operating mode, which can also be referred to as an enhanced mode or a super-evaporation mode, the cooling unit 40A can run using both the pre-cooler 160A and the dry coil 112A. Under extreme conditions, or when the outdoor air is hot or humid, the cooling unit 40A can provide pre-cooling to the scavenger air, using the pre-cooler 160A, before the scavenger air enters the evaporative cooler 110A. The pre-cooler 160A can be used to improve the cooling power of the unit 40A, allowing the evaporative cooler 110A to achieve lower discharge temperatures at the outlet 118A of the evaporative cooler 110A. The pre-cooler 160A can reduce or eliminate a need for supplemental mechanical cooling.

In summary, the three operating modes of the unit 40A can include economizer mode, evaporative mode and super-evaporative mode. The economizer mode can also be referred to as a dry mode since the evaporative cooler 110A is not operated in the economizer mode and thus the cooling unit 40A has minimal to zero water consumption in the dry mode. In the economizer mode, the increased temperature water returning from the coil 22 can be cooled using scavenger air. The other two operating modes of the unit 40A (evaporative and super-evaporative) can each also be referred to as a wet mode.

The water exiting the pre-cooler 160A can be directed to the inlet 116A of the evaporative cooler 110A through a water line 178A. A junction 181A of the water lines 178A and 180A is shown in FIG. 4A. It is recognized that the water lines 178A and 180A do not have to merge or join together prior to the inlet 116A and two separate water lines can be in fluid connection with the inlet 116A.

As provided above, the cooling fluid circuit of the pre-cooler 160A of FIG. 4A can be coupled with the evaporative cooler 110A since the cooling fluid for the pre-cooler 160A comes from the water in the tank 122A, which is produced by the evaporative cooler 110A. The pre-cooler 160A is further coupled in the design of FIG. 4A given that the cooling fluid, after exiting the pre-cooler 160A, flows through the evaporative cooler 110A.

The cooling unit 40A can include a system controller 148A to control operation of the cooling unit 40A and control an amount of cooling provided from the cooling unit 40A to the coil 22 (and thus to the enclosed space 12). The system controller 148A can be manual or automated, or a combination of both. The system controller 148A can be part of the system controller 50 of the system 10 (see FIG. 1) or the system controller 148A can be separate from the system 50.

The cooling unit 40A can be operated so that a temperature of the water in the tank 122A can be equal to a set point temperature that can be constant or variable. In a cooling unit 40A including a LLHX and a secondary coolant loop, the cooling unit 40A can be operated so that a temperature of the coolant leaving the LLHX can be equal to a set point temperature that can be constant or variable. Controlling to the temperature of the coolant can be in addition to or as an alternative to controlling to the temperature of the water in the tank 122A or the water leaving the tank 122A. The set point temperature can be determined based in part on the cooling requirements of the enclosed space 12. Water or coolant delivered to the coil 22 from the cooling unit 40A can cool the air in an enclosed space or cool one or more electrical components that can be enclosed or open to the atmosphere. The cooling unit 40A can be controlled to reduce overall water usage and power consumption, and increase heat rejection from the air in the enclosed space 12. The system controller 148A is described in further detail below.

Operation of the cooling unit 40A can be aimed at increasing the portion of sensible heating between the water and the scavenger air and decreasing the portion of latent heating between the water and the scavenger air. Water evaporation inside the evaporative cooler 110A can be optimized to minimize water consumption in the cooling unit 40A by at least one of using cooling coils before or after the evaporative cooler 110A and modulating a scavenger air flow rate through the cooling unit 40A. A greater portion of the heat load can be rejected in the dry coil 112A downstream of the evaporative cooler 110A, if the water returning to the cooling unit 40A is at a higher temperature. As a result, the scavenger air temperature at an outlet of the dry coil 112A can be higher. The evaporative cooler 110A can consume less water when the latent portion of the work performed in the evaporative cooler 110A is reduced.

In an example, the cooling unit 40A can be operated in an economizer mode in which the evaporative cooler 110A is turned off and bypassed so long as the set point temperature of the water delivered to the tank 122A can be met using the dry coil 112A. However, if the water in the tank is at a temperature above the set point, the cooling unit 40A can be operated in a normal mode which includes using the evaporative cooler 110A to cool the water. Similarly, if the set point temperature cannot be achieved in the normal mode, an enhanced mode can include using the pre-cooler 160A to condition the scavenger air before the scavenger air enters the evaporative cooler 110A.

The reduced-temperature water from the recovery coil 112A or evaporative cooler 110A can be part of a cooling fluid circuit that can extend from the plenum 104A and be delivered to the coil 22. After the water provides cooling to the air passing through the coil 22, the water can be recirculated through the cooling unit 40A. One or both of the tank 122A and pump 124A can be located physically in the plenum 104A, or one or both of the tank 122A and pump 124A can be physically located in the plenum 14 (see FIG. 1). Alternatively, one or both of the tank 122A and pump 124A can be located in a structure separate from the plenum 104A or plenum 14 and the enclosed space 12. Each of the water lines 129A, 130A, 178A and 180A can be inside or outside the plenum 104A, or partially inside and partially outside the plenum 104A. A location of the other water lines relative to the plenum 104A can depend in part on whether the tank 122A is inside or outside of the plenum 104A.

As provided above, the water line 126A can transport the water from the tank 122A to a cold water supply main, which can deliver the water to the coil 22. In an example, the enclosed space 12 can utilize multiple cooling units 40A for cooling and the cold water supply can be fluidly connected to each cooling unit 40A.

The system controller 148A can include hardware, software, and combinations thereof to implement the functions attributed to the controller herein. As provided above, the system controller 148A can be part of the controller 50 (see FIG. 1) or separate from the controller 50. The description of the system controller 148A below can also apply to the main controller 50 of the system 10. The system controller 148A can be an analog, digital, or combination analog and digital controller including a number of components. As examples, the controller 148A can include ICB(s), PCB(s), processor(s), data storage devices, switches, relays, etcetera. Examples of processors can include any one or more of a microprocessor, a controller, a digital signal processor (DSP), an application specific integrated circuit (ASIC), a field-programmable gate array (FPGA), or equivalent discrete or integrated logic circuitry. Storage devices, in some examples, are described as a computer-readable storage medium. In some examples, storage devices include a temporary memory, meaning that a primary purpose of one or more storage devices is not long-term storage. Storage devices are, in some examples, described as a volatile memory, meaning that storage devices do not maintain stored contents when the computer is turned off. Examples of volatile memories include random access memories (RAM), dynamic random access memories (DRAM), static random access memories (SRAM), and other forms of volatile memories known in the art. The data storage devices can be used to store program instructions for execution by processor(s) of the controller 148A. The storage devices, for example, are used by software, applications, algorithms, as examples, running on and/or executed by the controller 148A. The storage devices can include short-term and/or long-term memory, and can be volatile and/or non-volatile. Examples of non-volatile storage elements include magnetic hard discs, optical discs, floppy discs, flash memories, or forms of electrically programmable memories (EPROM) or electrically erasable and programmable (EEPROM) memories.

The system controller 148A can be configured to communicate with the cooling unit 40A and components thereof via various wired or wireless communications technologies and components using various public and/or proprietary standards and/or protocols. For example, a power and/or communications network of some kind may be employed to facilitate communication and control between the controller 148A and the cooling unit 40A. In one example, the system controller 148A can communicate with the cooling unit 40A via a private or public local area network (LAN), which can include wired and/or wireless elements functioning in accordance with one or more standards and/or via one or more transport mediums. In one example, the unit 40A can be configured to use wireless communications according to one of the 802.11 or Bluetooth specification sets, or another standard or proprietary wireless communication protocol. Data transmitted to and from components of the unit 40A, including the controller 148A, can be formatted in accordance with a variety of different communications protocols. For example, all or a portion of the communications can be via a packet-based, Internet Protocol (IP) network that communicates data in Transmission Control Protocol/Internet Protocol (TCP/IP) packets, over, for example, Category 5, Ethernet cables.

The system controller 148A can include one or more programs, circuits, algorithms or other mechanisms for controlling the operation of the cooling unit 40A. For example, the system controller 148A can be configured to modulate the speed of the fan 114A and/or control actuation of the valve 132A to direct cooling fluid from the outlet of the dry coil 112A to either the inlet 116A of evaporative cooler 110A or the tank 122A. The system controller 148A can also be configured to operate the unit 40A in the three modes described above.

The cooling unit 40A can maximize the cooling potential in the evaporative cooler 110A and modulate the scavenger air through the plenum 104A based on the outdoor air conditions. The economizer mode, for example, in winter, can provide a reduction in water usage and power consumption compared to conventional cooling systems.

The unit 40A can utilize reduced-temperature water (from the dry coil 112A or the evaporative cooler 110A) to provide cooling to the enclosed space 12. In an example, the enclosed space 12 can be a data center. In the systems described herein, less energy can be used to deliver the reduced-temperature water from the cooling unit 40A to the data center, as compared to existing air designs. Such existing designs can include hot process air from the data center being delivered to the cooling system which can be configured as a larger unit for two air flow paths—the process air and the scavenger air. Thus more energy is used in such designs to move the hot process air from the data center to the cooling system and then condition the process air. Moreover, water has a higher thermal capacity than air; thus a lower flow rate of water can be used, compared to air, to reject a certain amount of heat directly from one or more electrical components in the data center (or other components needing cooling) or from the air in the data center.

FIG. 4B illustrates another example cooling unit 40B for providing liquid cooling to the enclosed space 12 via the coil 22. The cooling unit 40B can be similar in many aspects to the cooling unit 40A of FIG. 4A and can include a pre-cooler 160B, an evaporative cooler 110B, a dry coil 112B and a fan 114B, all of which can be arranged within a scavenger plenum 104B as described above for the unit 40A. However, in contrast to the unit 40A of FIG. 4A, the cooling unit 40B can have two separate water tanks, as well as an additional pump and flow path to the evaporative cooler 110B. As described below, the design in FIG. 4B can allow for additional operating modes of the unit 40B, as compared to the unit 40A. The unit 40B can include a system controller 148B that can be similar to the system controller 148A described above for the unit 40A.

The cooling unit 40B can include a first tank 122B and a second tank 123B. The first tank 122B can be generally configured to provide a reduced temperature cooling fluid to the coil 22 and the second tank 123B can be generally configured as the water supply for the evaporative cooler 110B. However, each of tanks 122B and 123B can receive water from the evaporative cooler 110B and the recovery coil 112B, depending on an operating mode of the unit 40B.

In an example, the first tank 122B can be fluidly connected to the coil 22 such that the reduced-temperature water can flow from the tank 122B to the coil 22 through a water line 126B using a pump 124B, as configured with the unit 40A. In another example, water can drain out of the tank 122B to another external collection reservoir, where it can then be pumped to the coil 22. This can eliminate a supply pump (124B) inside the plenum 104B.

The increased-temperature water leaving the coil 22 can be returned to the recovery coil 112B (via a water line 128B) in order to cool the increased temperature water, which can then exit the recovery coil 112B through a water line 130B. The flow path into and out of the recovery coil 112B can be the same as in the unit 40A. However, a bypass valve 132B can control distribution of the reduced-temperature water either to the first tank 122B through a water line 129B or to the second tank 123B through a water line 180B. This is different from the unit 40A in which the bypass valve 132A can direct water in the water line 130A to the evaporative cooler 110A directly, rather than to the second tank 123B as shown in FIG. 4B. As provided below, a position of the valve 132B can depend on the operating mode of the unit 40B.

The second tank 123B can provide water to an inlet 116B of the evaporative cooler 110B using a pump 154B and a water line 121B. The separation of the two tanks 122B and 123B in the design of FIG. 4B can replace the junction 181A of the design of FIG. 4A. Moreover, the design of FIG. 4B having the two tanks 122B and 123B can facilitate operation of the evaporative cooler 110B in an evaporation mode and an adiabatic mode, as described further below.

After flowing through the evaporative cooler 110B, the water can exit the evaporative cooler 110B through a water line 120B. A bypass valve 182B can control the distribution of water from the evaporative cooler 110B to the first tank 122B (via a water line 135B) and the second tank 123B (via a water line 131B). The valve 182B is not included in the design of FIG. 4A and is described further below in reference to the operating modes of the unit 40B.

As provided above in reference to the unit 40A, the pre-cooler 160B can selectively be used depending on the outdoor air conditions and an operating mode of the unit 40A. Similar to the design of the unit 40A, the pre-cooler 160B can receive reduced-temperature water from the first tank 122B using a pump 172B and water line 174B. The water can exit the pre-cooler 160B at an increased temperature. In contrast to the design of the unit 40A, the increased-temperature water from the pre-cooler 160B can be directed to the second tank 123B through a water line 178B, rather than through the evaporative cooler 110B. Similar to the design of the unit 40A, the pre-cooler 160B of the unit 40B, as shown in FIG. 4B can have a coupled design and the cooling fluid for the pre-cooler 160B can come from the first tank 122B. In other examples, the pre-cooler 160B can be partially or fully decoupled.

In an example, the unit 40B can operate in the three modes described above for the unit 40A, but the unit 40B can also operate in at least two additional modes as compared to the unit 40A.

In an economizer mode (first mode of the unit 40A), only the recovery coil 112B is used to cool the water or other cooling fluid that provides liquid cooling to the coil 22 for the enclosed space 12. The cold water exiting the recovery coil 112B can pass through the three-way valve 132B which can divert essentially all of the water in the water line 130B to the first tank 122B. The first tank 122B can supply the cold water to the coil 22 using the pump 124B. In the economizer mode, the pumps 154B and 172B can be turned off since the evaporative cooler 110B and pre-cooler 160B are not being used. The scavenger air can enter the plenum 104B through the bypass dampers 134B.

The unit 40B can operate in an adiabatic mode that can considered to be between the economizer mode and the evaporation mode (second mode of the unit 40A) in terms of the energy usage and the cooling requirements needed by the enclosed space 12. The bypass valve 132B can be in the same position and the delivery of cold water to the coil 22 can be the same as described above in the economizer mode. In the adiabatic mode, the evaporative cooler 110B can be configured to circulate water from the second tank 123B through the evaporative cooler 110B in a closed fluid circuit. The pump 154B can be on and water can be provided through the water line 121B to the inlet 116B of the evaporative cooler. The bypass valve 182B can be positioned such that essentially all of the water exiting the evaporative cooler 110B at the outlet 118B can be directed to the second tank 123B. Thus the flow of water through each of the evaporative cooler 110B and the recovery coil 112B can be separate from one another via the two tanks 122B and 123B. In this adiabatic mode, the tank 123B can be essentially dedicated to the recovery coil 112B and the tank 122B can be essentially dedicated to the evaporative cooler 110B.

During operation of the evaporative cooler 110B in the adiabatic mode, a temperature of the water (or other cooling fluid) can remain generally constant or have minimal temperature fluctuations. The outdoor air conditions can be such that sufficient conditioning of the scavenger air stream can be provided by the water in the tank 123B through recirculation of the water in the closed fluid circuit. As the scavenger air passes through the evaporative cooler 110B, it can be cooled adiabatically such that its temperature can be reduced, but its humidity level can increase, while its overall enthalpy can remain constant. The reduced-temperature air can be supplied to the recovery coil 112B and the recovery coil 112B can supply water at the required temperature set point. This adiabatic process or mode can significantly reduce or minimize water consumption by the cooling unit 40B and can be used when operation of the unit 40B in the economizer mode is not able to reach the set point temperature for the cold water supply to the coil 22.

In an evaporation mode (second mode of the unit 40A), the evaporative cooler 110B can be switched over from operating adiabatically. A position of the bypass valve 132B can be changed to direct water from the recovery coil 112B to the second tank 123B. Similarly, a position of the bypass valve 182B can be changed to direct water from the evaporative cooler 110B to the first tank 122B. An equalization valve 137B can be located between the two tanks 122B and 123B. The valve 137B can be closed during the economizer and adiabatic modes, and can be opened in the evaporation mode to stabilize the tank levels. The evaporation mode in the unit 40B can be similar to that described above for the unit 40A in that the fluid circuit through the evaporative cooler 110B can be in fluid connection with the fluid circuit through the recovery coil 112B.

In an example, in the evaporation mode, essentially all or a majority of the water from the recovery coil 112B can be redirected to the second tank 123B and essentially all or a majority of the water from the evaporative cooler 110B can be redirected to the first tank 122B. In another example, in the evaporation mode, the distribution to each tank 122B and 123B can be split for one or both of the water from the evaporative cooler 110B and the recovery coil 112B. In an example, instead of the equalization valve 137B, the tanks 122B and 123B can be separated by a dividing wall and a height of the wall can be lowered such that the wall can function as a weir. If one tank level rises too high, the water can spill over the weir into the other tank.

During operation in the adiabatic and evaporation modes, the scavenger air can enter the plenum 104B at an inlet 106B and the pre-cooler 160B can be off. In another example, the plenum 104B can include bypass dampers downstream of the pre-cooler 160B and upstream of the evaporative cooler 110B to bypass the pre-cooler 160B and direct the scavenger air into the evaporative cooler 110B.

In an enhanced mode or a super-evaporation mode (third mode of the unit 40A), the pump 172B can be turned on to direct water through the pre-cooler 160B. The cold water for the pre-cooler 160B can come from the first tank 122B. After exiting the pre-cooler 160B at an increased-temperature, the water can be delivered to the second tank 123B. Similar to the unit 40A, as shown in FIG. 4B, the pre-cooler 160B can have a coupled design within the cooling unit 40B. In other examples, the pre-cooler 160B can have a partially decoupled or fully decoupled design.

The unit 40B can be controlled to run at the lowest operating mode (in terms of energy and water usage) that is sufficient for meeting the liquid cooling requirements for the enclosed space 12 in the indirect mode. The design of the unit 40B can allow for an additional mode that can include operating the evaporative cooler 110B adiabatically and running the pre-cooler 160B. This mode can be considered somewhat of a hybrid mode that is generally between the adiabatic mode and the enhanced mode. The four operating modes of the unit 40B can include an economizer mode, adiabatic mode, evaporative mode and super-evaporative mode. As described in reference to the unit 40A, the economizer mode for the unit 40B can be referred to as a dry mode. The other three modes can include operating the evaporative cooler 110B and thus each of the three modes can be referred to as a wet mode.

It is recognized that the cooling units 40A and 40B of FIGS. 4A and 4B, respectively, are two examples of a cooling system for produced a reduced temperature cooling fluid (for example, cold water) that can be used to provide liquid cooling to the air from the enclosed space 12 when the system 10 of FIG. 1 is operating in an indirect mode. Other designs of a cooling system that includes an evaporative cooler (and can operate in a dry mode and a wet mode) can be used in addition to or as an alternative to the cooling units 40A and 40B of FIGS. 4A and 4B.

In an example, the hybrid system 10 of FIG. 1 can operate in seven modes which are listed in Table 2 below.

TABLE 2

Operating Modes for Hybrid System of FIG. 1

| Number | System Mode | Cooling Unit: On or Off? | Cooling Unit Mode |
|---|---|---|---|
| 1 | Indirect | ON | Economizer |
| 2 | Indirect | ON | Adiabatic |
| 3 | Indirect | ON | Evaporative |
| 4 | Indirect | ON | Super-Evaporative |
| 5 | Direct | ON | Any wet or dry mode |
| 6 | Direct | OFF | N/A |
| 7 | Mixed | OFF | N/A |

FIG. 5 is a psychometric chart illustrating the conditions for each of the seven modes in Table 2 for the hybrid system 10. The numbers in Table 2 for each mode correspond with the numbers in FIG. 5. As demonstrated by Table 2, the operating modes of the system 10 can include 100% indirect (FIG. 1A), 100% direct with cooling (FIG. 1B), 100% direct without cooling (FIG. 1C), and mixed (FIG. 1D); for the 100% indirect mode, there are four sub-modes. Each of the four sub-modes for indirect cooling correspond to the four operating modes of the cooling unit 40B of FIG. 4B—economizer, adiabatic, evaporative and super-evaporative.

The number of sub-modes of the indirect cooling mode can be a function of the design of the cooling unit 40 of the system 10. If the cooling unit 40B is replaced in the hybrid system 10 with the cooling unit 40A of FIG. 1A, the hybrid system 10 can have three-sub modes of indirect cooling, and thus a total of six modes, instead of the seven modes listed above in Table 2.

As provided below, in mode #5 (direct with cooling), any of the sub-modes for indirect cooling mode can be used. In other words, in mode #5, 100% outdoor air can be delivered to the enclosed space 12 but the outdoor air can be cooled using the coil 22 (see FIG. 1B); the reduced temperature cooling fluid used in the coil 22 can be produced under a dry mode or a wet mode and thus under any of the sub-modes described herein for indirect cooling—economizer, adiabatic, evaporative, and super-evaporative.

Referring back to FIG. 5, the psychometric chart shows what mode can be selected for operation of the hybrid system 10. The selection can depend on the outdoor air conditions—including a dry bulb temperature, a wet bulb temperature, a humidity ratio, and relative humidity. In an example, selection of the operating mode can also depend on additional factors, such as, for example, outdoor air quality and restrictions on water usage.

When the ambient humidity levels permit, the hybrid system 10 can operate in modes #5, #6 or #7. In modes #6 or #7, the external cooling unit 40 can be off. In mode #6, 100% outdoor air can be delivered to the enclosed space 12, as is, and all of the hot return air exiting the enclosed space 12 through the return air duct 26 can be outlet as exhaust air. (See FIG. 1C.) The outdoor air conditions in mode #6 can be such that the outdoor air can replace the hot return air in the enclosed space 12, without reducing a temperature of the air or adjusting the humidity of the air. In mode #7, return air from the enclosed space 12 can mix with outdoor air. (See FIG. 1D.) The mixed mode can be used when the dry bulb temperature of the outdoor air is low or the relative humidity is high, and the mixed air stream of outdoor air and return air can maintain the humidity levels inside the enclosed space 12 without having to humidify the outdoor air before the outdoor air is delivered to the enclosed space 12.

In modes #6 and #7, there is essentially no conditioning of the air being delivered to the enclosed space 12. Thus modes #6 and #7 can contribute to the efficiency in operating the system 10, in terms of at least energy and water.

In mode #5, the cooling unit 40 can be on. The temperature of the outdoor air can be higher than an acceptable range for the enclosed space 12 but the humidity of the outdoor air can be within an acceptable range. Thus the cooling unit 40 can be used to provide reduced temperature cooling fluid to the coil 22 and reduce the temperature of the outdoor air passing through the coil 22 (see FIG. 1B). This can reduce a cooling load on the coil 22, as compared to if the system 10 were operating in modes #3 or #4 in which evaporative cooling in the unit 40 is used in the indirect mode to condition the return air from the enclosed space.

If there is any risk of degrading the air quality inside the enclosed space 12 by using outdoor air, the hybrid system 10 can switch from mode #6 or #7 to one of the indirect cooling modes (modes #1-4), regardless of the temperature and humidity of the outdoor air. As such, the air quality inside the enclosed space 12 can be maintained within desired levels, regardless of the air quality of the outdoor air.

If the system 10 switches from either of modes #6 or #7 to an indirect cooling mode (due to air quality rather than a change in humidity or temperature), the system 10 can likely switch to mode #1 in which the cooling unit 40 operates in a dry mode or economizer mode. This is exemplified in FIG. 5, given the proximity of modes #6 and #7 to mode #1. In other words, the outdoor air conditions that equate to operating in modes #6 and #7 can be similar or overlap with the outdoor air conditions that equate to operating in mode #1. In mode #1, the outdoor air conditions can be sufficient to provide liquid cooling to the return air without having to use the evaporative cooler in the cooling unit 40 and without having to humidify the return air. Similar to modes #6 and #7, mode #1 can minimize energy or water consumption in operating the system 10.

If the system 10 is operating in mode #6 or #7 and the humidity levels of the outdoor air decrease below a predetermined limit, the system 10 can switch to mode #1 in order to maintain the humidity level of the air in the enclosed space 12 within an acceptable range. Operation of the system 10 in mode #1 can address the excessive humidification requirements associated with direct-air optimization (DAO) systems when such systems are operating in cold and dry air conditions. These types of DAO systems can commonly consume excessive amounts of water in the cold/dry operating months in order to maintain the air in the enclosed space 12 within an acceptable range of conditions. Rather than use outdoor air and humidify the outdoor air before delivering the outdoor air to the enclosed space, mode #1 can enable the system 10 to efficiently condition the return air from the enclosed space by operating in a dry mode or an economizer mode of the external cooling unit 40.

On the other hand, if the outdoor air conditions are such that the humidity levels exceed the acceptable range, the system 10 can operate in an indirect mode to condition the return air, rather than dehumidify the outdoor air. This can eliminate the need for dehumidification of the outdoor air, as is commonly required in DAO systems. Such dehumidification capabilities in DAO systems can result in oversizing of the system to account for sensible and latent loads of the outdoor air.

The indirect cooling modes #2-4 can each be defined as a wet mode since each of modes #2-4 can include operation of the evaporative cooler in the cooling unit 40. Mode #2 can involve adiabatic operation of the evaporative cooler. (See description of the cooling unit 40B of FIG. 4B.) Mode #3 can involve evaporative cooling of the evaporative cooler in the cooling unit 40. Mode #4 can involve super-evaporative cooling in which a pre-cooler located upstream of the evaporative cooler can be used to pre-condition the scavenger air prior to the scavenger air passing through the evaporative cooler. In an example, all of the cooling requirements for the enclosed space 12 can be met by one of the wet modes #2-4 without requiring the addition of mechanical chillers. The particular mode selected from wet modes #2-4 can be based on providing enough cooling to the reduced temperature cooling fluid such that the cooling fluid can sufficiently condition the air passing through the coil 22, while minimizing energy and water usage.

In summary, a direct mode (with or without cooling) can be used when ambient conditions permit and 100% indirect cooling can be used when ambient conditions are not sufficient or outdoor air quality is not acceptable. A mixed mode can be used when the outdoor air is too cold or the relative humidity is too high, but the humidity range is acceptable. The indirect cooling modes of the system 10 can eliminate the need to humidify or dehumidify the outdoor air stream before supplying outdoor air to the enclosed space 12. The particular sub-mode of indirect cooling can be determined to meet the cooling load for the enclosed space, but minimize energy and water consumption.

The hybrid system 10 of the present application focuses on the capability to operate in a direct mode (with or without cooling), an indirect cooling mode, and a mixed mode. It is recognized that the external cooling unit 40 utilized in the indirect mode can have additional or alternative components, or a different configuration, to what is shown in FIGS. 4A and 4B for use in combination with the evaporative cooler of the external cooling unit 40. Although four sub-modes for indirect cooling are described herein (one dry mode; three wet modes), it is recognized that the external cooling unit 40 can exclude one or more of these wet modes. As provided above, the benefits of the system 10 can include the ability to switch between modes as needed or desired, for example, to save water or to preserve air quality inside the enclosed space 12.

FIG. 6 is a flow chart illustrating a process 200 for determining an operating mode of the hybrid system 10. An initial inquiry at 202 can include whether ambient conditions are within allowed indoor air conditions. If yes at 202, at 204 an inquiry can be whether there is a risk for indoor air quality (IAQ) degradation. If no at 204, an operating mode at 206 can be 100% direct without cooling (mode #6 above). If yes at 204, at 208 the inquiry can be whether ambient conditions are within indirect economizer mode limits. If yes at 208, an operating mode at 210 can be 100% indirect—economizer (mode #1). If no at 208, at 212 an inquiry can be whether ambient conditions are within adiabatic mode limits. If yes at 212, an operating mode at 214 can be 100% indirect—adiabatic (mode #2). If no at 212, at 216 an inquiry can be whether ambient conditions are within evaporative mode limits. If yes at 216, an operating mode at 218 can be 100% indirect—evaporative (mode #3). If no at 216, an operating mode at 220 can be 100% indirect—super-evaporative (mode #4).

Referring back to 202, if the answer is no (i.e. ambient conditions are not within allowed indoor air conditions), at 222 an inquiry can be whether ambient temperature is less than or equal to an allowed indoor air temperature. If yes at 222, an inquiry at 224 can be whether ambient humidity is within allowed indoor air conditions. If yes at 224, an inquiry at 226 can be whether there is a risk for indoor air quality (IAQ) degradation. If no at 226, an operating mode at 228 can be mixed (mode #7) and the cooling unit 40 can be off. Referring back to 224, if the answer is no (i.e. ambient humidity is not within allowed indoor air conditions), at 230, an inquiry can be whether ambient conditions are within economizer mode limits. Note this is the same inquiry as at 208. If yes at 230, an operating mode at 232 can be 100% indirect—economizer (mode #1). If the answer is no at 230, an inquiry at 212 can be whether the ambient conditions are within adiabatic mode limits. The answer at 212 determines whether the particular indirect operating mode is adiabatic, evaporative or super-evaporative, as described above in reference to 214-220.

Referring back to 222, if the answer is no (i.e. ambient temperature is not less than or equal to the allowed indoor air temperature), an inquiry at 234 can be whether the return air temperature is greater than the ambient air temperature. If no at 234, the next inquiry can be at 212 which is described above and determines whether the particular indirect operating mode is adiabatic, evaporative or super-evaporative. If yes at 234, an inquiry at 236 can be whether the ambient humidity is within allowed indoor air conditions. If no at 236, the next inquiry can be at 212. If yes at 236, an inquiry at 238 can be whether there is a risk for indoor air quality (IAQ) degradation. If yes at 238, the next inquiry can be at 212. If no at 238, an operating mode at 240 can be 100% direct with cooling (mode #5). The sub-mode of the cooling unit 40 under mode #5 can be the dry mode or any of the wet modes (adiabatic, evaporative or super-evaporative). The sub-mode can be determined based on ambient conditions.

It is recognized that a control system, including but not limited to the controllers 50, 148 and 148B described above, can be used to determine the operating modes. It is recognized that the process 200 can vary from what is shown in FIG. 6. For example, the process 200 does not have to follow in the specific sequence presented in FIG. 6. Moreover, it is recognized that additional or alternative inquires or decision points can be used to determine an operating mode for the hybrid system 10. The flow chart for the process 200 can also depend on the operating modes of the cooling unit 40 that is used to provide indirect cooling in the hybrid system 10.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Examples, as described herein, may include, or may operate on, logic or a number of components, modules, or mechanisms. Modules may be hardware, software, or firmware communicatively coupled to one or more processors in order to carry out the operations described herein. Modules may hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The present application provides for the following exemplary embodiments or examples, the numbering of which is not to be construed as designating levels of importance:

Example 1 provides a system to condition air for an enclosed space, the system comprising: a plenum for supplying air to the enclosed space, the plenum having an outside air inlet, a return air inlet, and a supply air outlet in fluid communication with the enclosed space, wherein the outdoor air inlet and the return air inlet selectively open and close such that an amount of outdoor air and an amount of return air supplied to the enclosed space varies and depends on an operating mode of the system; a cooling unit comprising an evaporative cooler and located external to the plenum and the enclosed space, the cooling unit having a first cooling fluid circuit configured to selectively circulate a first cooling fluid to reduce a temperature of the first cooling fluid, the cooling unit configured to operate in a dry mode and a wet mode; a coil disposed inside the plenum and having a second cooling fluid circuit configured to selectively circulate a second cooling fluid through the coil to condition air passing through the coil, depending on the operating mode of the system, wherein the first cooling fluid exiting the cooling unit reduces a temperature of the second cooling fluid prior to circulating the second cooling fluid through the coil; and a return air duct in fluid communication with the enclosed space, the return air duct configured to deliver return air from the enclosed space to at least one of the return air inlet and an exhaust air outlet, depending on the operating mode of the system.

Example 2 provides the system of Example 1 optionally configured such that the operating mode of the system comprises an indirect mode in which the outdoor air inlet and the exhaust air outlet are closed, the return air inlet is open, and the cooling unit is on, and wherein return air from the enclosed space is directed through the plenum and conditioned by the coil before being delivered back to the enclosed space as supply air.

Example 3 provides the system of Example 1 and/or 2 optionally configured such that the cooling unit comprises a scavenger air plenum configured to direct outdoor air from an inlet to an outlet of the scavenger air plenum, and wherein the evaporative cooler is disposed inside the scavenger air plenum.

Example 4 provides the system of Example 3 optionally configured such that the cooling unit comprises a dry coil disposed inside the scavenger air plenum.

Example 5 provides the system of Example 4 optionally configured such that the dry coil is disposed downstream of the evaporative cooler.

Example 6 provides the system of Example 4 and/or 5 optionally configured such that the outdoor air bypasses the evaporative cooler in the dry mode and passes through the dry coil such that, in the dry mode, the outdoor air is sufficient to reduce a temperature of the first cooling fluid flowing through the dry coil.

Example 7 provides the system of any of Examples 2-6 optionally configured such that the wet mode comprises an adiabatic mode in which an evaporative cooling fluid flowing through the evaporative cooler is contained within a closed fluid circuit of the evaporative cooler, and an evaporative mode in which the evaporative cooling fluid flowing through the evaporative cooler is in fluid connection with the first cooling fluid of the cooling unit.

Example 8 provides the system of any of Examples 2-7 optionally configured such that the cooling unit comprises a pre-cooler disposed inside the scavenger air plenum upstream of the evaporative cooler.

Example 9 provides the system of Example 8 optionally configured such that the wet mode comprises a super-evaporative mode in which the pre-cooler circulates a pre-cooling fluid to selectively condition the outdoor air, prior to passing the outdoor air through the evaporative cooler.

Example 10 provides the system of any of Examples 1-9 wherein the operating mode of the system comprises a direct mode in which the outdoor air inlet and the exhaust air inlet are open, the cooling unit is off, and wherein outdoor air enters the plenum and is delivered to the enclosed space as supply air.

Example 11 provides the system of Example 10 optionally configured such that the direct mode includes a first direct mode in which the cooling unit is off and the outdoor air is delivered to the enclosed space without reducing a temperature of the outdoor air.

Example 12 provides the system of Example 11 optionally further comprising a bypass duct having a bypass inlet located upstream of the coil and a bypass outlet located downstream of the coil, wherein the bypass duct is configured to selectively direct air flowing through the plenum into the bypass duct and return the air to the plenum downstream of the coil such that the air bypasses the coil when the system is operating in the first direct mode.

Example 13 provides the system of Example 11 optionally configured such that when the system is operating in the first direct mode, the coil is not operational and the outdoor air passes through the non-operational coil prior to be delivered to the enclosed space.

Examples 14 provides the system of any of Examples 10-13 optionally configured such that the direct mode includes a second direct mode in which the cooling unit is on and the outdoor air passes through the coil to reduce a temperature of the outdoor air prior to delivering the outdoor air to the enclosed space.

Example 15 provides the system of Example 14 optionally configured such that the cooling unit operates in a plurality of modes, and a selected mode from the plurality of modes depends on outdoor air conditions.

Example 16 provides the system of any of Examples 10-15 optionally configured such that the direct mode includes a mixed mode in which the cooling unit is off, the return air inlet is open, and wherein a first portion of the return air flowing through the return air duct is exhausted to outside through the exhaust air outlet and a second portion of the return air flowing through the return duct enters the plenum at the return air inlet and mixes with the outdoor air for delivery of a mixed air stream to the enclosed space.

Example 17 provides the system of Example 16 optionally configured such that the return air mixes with the outdoor air upstream of a bypass inlet of a bypass duct, the bypass duct configured to selectively direct the mixed air stream into the bypass duct to bypass the coil, and wherein the mixed air stream exists the bypass duct through a bypass outlet in fluid connection with the plenum.

Example 18 provides the system of Example 16 optionally configured such that the coil is not operational in the mixed mode, and wherein the outdoor air and the return air mixes upstream of the coil, and the mixed air stream passes through the non-operational coil prior to be delivered to the enclosed space.

Example 19 provides the system of any of Examples 10-15 optionally configured such that the return air inlet is closed, and wherein essentially all of the return air flowing through the return duct is exhausted to outside.

Example 20 provides the system of any of Examples 1-19 optionally configured such that the first cooling fluid and the second cooling fluid are the same and the first cooling fluid circuit is fluidly connected to the second cooling fluid circuit.

Example 21 provides the system of any of Examples 1-19 optionally configured such that the first cooling fluid circuit and the second cooling fluid circuit are separate from each other, and the system comprises: a liquid to liquid heat exchanger configured to circulate the first and second cooling fluids such that the first cooling fluid reduces a temperature of the second cooling fluid, prior to circulating the second cooling fluid through the coil.

Example 22 provides the system of any of Examples 1-21 optionally configured such that the reduced temperature cooling fluid is water.

Example 23 provides the system of any of Examples 1-22 optionally configured such that the evaporative cooler is a liquid-to-air membrane energy exchanger (LAMEE).

Example 24 provides the system of any of Examples 1-23 optionally configured such that the enclosed space is a data center.

Example 25 provides the system of any of Examples 1-24 optionally further comprising at least one filter disposed inside the plenum at a location upstream of the coil.

Example 26 provides the system of any of Examples 1-25 optionally further comprising a fan downstream of the coil and upstream of the supply air outlet.

Example 27 provides the system of Example 26 optionally configured such that the fan comprises a fan array of multiple fans.

Example 28 provides a method of conditioning air for an enclosed space, the method comprising directing air through a plenum, the air including outdoor air, return air from the enclosed space, or a combination thereof; delivering the air from the plenum to the enclosed space as supply air; selectively operating an external cooling unit having a first cooling fluid circuit configured to circulate a first cooling fluid, the external cooling unit located external to the plenum and the enclosed space, the external cooling unit comprising an evaporative cooler and configured to operate in a dry mode and a wet mode to reduce a temperature of the first cooling fluid; and selectively directing a second cooling fluid through a coil disposed inside the plenum to provide liquid cooling to air directed through the coil, wherein the second cooling fluid is fluidly connected to the first cooling fluid or the second cooling fluid is cooled by the first cooling fluid prior to being directed through the coil.

Example 29 provides the method of Example 28 optionally further comprising determining an operating mode of the system based on an ambient temperature and humidity, the operating mode comprising: a direct mode in which an outdoor air inlet of the plenum is open and outdoor air enters the plenum, an exhaust air outlet is open and a portion of the return air from the enclosed space is exhausted to outside; an indirect mode in which the outdoor air inlet and the exhaust air outlet are closed, the external cooling unit is on, and return air from the enclosed space is conditioned by the second cooling fluid flowing through the coil; and a mixed mode in which the outdoor air inlet and the exhaust air outlet are each at least partially open, the cooling unit is off and return air from the enclosed space mixes with outdoor air to create a mixed air stream that is delivered to the enclosed space as supply air.

Example 30 provides the method of Example 29 optionally further comprising: diverting the air in the plenum through a bypass duct to bypass the coil, when the system is operating in the direct mode or mixed mode.

Example 31 provides the method of Example 30 optionally configured such that diverting the air through the bypass duct includes directing the air through a bypass inlet upstream of the coil and directing the air through a bypass outlet downstream of the coil.

Example 32 provides the method of any of Examples 29-31 optionally configured such that the direct mode comprises a first direct mode in which the external cooling unit is off and the outdoor air is delivered to the enclosed space without reducing a temperature of the outdoor air.

Example 33 provides the method of any of Examples 29-32 optionally configured such that the direct mode comprises a second direct mode in which the external cooling unit is on and the outdoor air passes through the coil to reduce a temperature of the outdoor air prior to delivering the outdoor air to the enclosed space.

Example 34 provides the method of Example 33 optionally configured such that selectively operating the external cooling unit in the second direct mode comprises operating the external cooling unit in a plurality of modes, and a selected mode from the plurality of modes depends on outdoor air conditions.

Example 35 provides the method of any of Examples 28-34 optionally configured such that the external cooling unit comprises a scavenger air plenum configured to receive an outdoor air stream, and wherein the evaporative cooler is disposed inside the scavenger air plenum.

Example 36 provides the method of Example 35 optionally configured such that the evaporative cooler is not operational in the dry mode of the external cooling unit, and wherein the external cooling unit comprises a dry coil arranged in the scavenger air plenum downstream of the evaporative cooler.

Example 37 provides the method of Example 36 optionally configured such that selectively operating the external cooling unit comprises: directing the first cooling fluid through the dry coil to cool the first cooling fluid with the outdoor air stream.

Example 38 provides the method of Example 36 and/or 37 optionally configured such that selectively operating the external cooling unit in the wet mode comprises: operating the external cooling unit in an adiabatic mode, wherein an evaporative cooling fluid flowing through the evaporative cooler is separate from the first cooling fluid.

Example 39 provides the method of any of Examples 36-38 optionally configured such that operating the external cooling unit in the wet mode comprises: operating the external cooling unit in an evaporative mode, wherein the first cooling fluid circulates through the evaporative cooler and the dry coil.

Example 40 provides the method of any of Examples 36-39 optionally configured such that the external cooling unit comprises a pre-cooler arranged in the scavenger air plenum upstream of the evaporative cooler, and wherein operating the external cooling unit in the wet mode comprises: directing the outdoor air stream through the pre-cooler to condition the outdoor air; and reducing a temperature of the first cooling fluid using the evaporative cooler and the dry coil.

Example 41 provides the method of any of Examples 28-40 optionally configured such that the first cooling fluid and the second cooling fluid are different, and the method further comprises reducing a temperature of the second cooling fluid in a liquid to liquid heat exchanger (LLHX) using the reduced temperature first cooling fluid exiting the external cooling unit.

Example 42 provides a system or method of any one or any combination of Examples 1-41, which can be optionally configured such that all steps or elements recited are available to use or select from.

Various aspects of the disclosure have been described. These and other aspects are within the scope of the following claims.

What is claimed is:

1. A system to condition air for an enclosed space, the system comprising:
   a plenum for supplying air to the enclosed space, the plenum having an outdoor air inlet, a return air inlet, and a supply air outlet in fluid communication with the enclosed space, wherein the outdoor air inlet and the return air inlet selectively open and close such that an amount of outdoor air and an amount of return air supplied to the enclosed space varies and depends on an operating mode of the system;
   a cooling unit comprising an evaporative cooler and located external to the plenum and the enclosed space, the cooling unit having a first cooling fluid circuit configured to selectively circulate a first cooling fluid to reduce a temperature of the first cooling fluid, the cooling unit configured to operate in a plurality of cooling modes;
   a coil disposed inside the plenum and having a second cooling fluid circuit configured to selectively circulate a second cooling fluid through the coil to condition air passing through the coil, depending on the operating mode of the system, wherein the first cooling fluid exiting the cooling unit reduces a temperature of the second cooling fluid prior to circulating the second cooling fluid through the coil; and
   a return air duct in fluid communication with the enclosed space, the return air duct configured to deliver return air from the enclosed space to at least one of the return air inlet and an exhaust air outlet, depending on the operating mode of the system, wherein:
   the operating mode of the system comprises a direct mode, an indirect mode, and a mixed mode;
   the operating mode of the system determines air flow through the system and operation of the cooling unit;
   the plurality of cooling modes includes a dry mode and a wet mode;
   the dry mode includes an economizer mode; and
   the wet mode includes an adiabatic mode, an evaporative mode, and a super-evaporative mode.

2. The system of claim 1 wherein in the indirect mode the outdoor air inlet and the exhaust air outlet are closed, the return air inlet is open, and the cooling unit is on, and wherein return air from the enclosed space is directed through the plenum and conditioned by the coil before being delivered back to the enclosed space as supply air.

3. The system of claim 2 wherein the cooling unit comprises a scavenger air plenum configured to direct outdoor air from an inlet to an outlet of the scavenger air plenum, and wherein the evaporative cooler is disposed inside the scavenger air plenum.

4. The system of claim 3 wherein the cooling unit comprises a dry coil disposed inside the scavenger air plenum.

5. The system of claim 4 wherein the dry coil is disposed downstream of the evaporative cooler.

6. The system of claim 5, wherein on condition that outdoor air can cool the return air to a pre determined temperature without additional cooling from the cooling unit, and the return air does not require any humidification, the system can operate with the operating mode in the direct mode or the indirect mode with the cooling unit off.

7. The system of claim 6, wherein on condition that humidity levels of outside air decreases below a predetermined limit, the operating mode can be changed to the indirect mode, and the cooling unit can operate in the economizer mode, and wherein in the economizer mode, the outdoor air bypasses the evaporative cooler and passes through the dry coil such that the outdoor air is sufficient to reduce a temperature of the first cooling fluid flowing through the dry coil.

8. The system of claim 5, wherein on condition that outdoor air conditions are not sufficient to cool the return air to a pre-determined temperature without the cooling unit, the system can operate with the operating mode in the indirect mode with the cooling unit on and in the wet mode.

9. The system of claim 8, wherein the adiabatic mode includes an evaporative cooling fluid flowing through the evaporative cooler, which is contained within a closed fluid circuit of the evaporative cooler; and
wherein the evaporative mode includes the evaporative cooling fluid flowing through the evaporative cooler, which is fluidically connected with the first cooling fluid of the cooling unit.

10. The system of claim 9, wherein on condition that outdoor air conditions are within adiabatic mode limits, the cooling unit can operate in the adiabatic mode, and wherein on condition that the outdoor air conditions are within evaporative mode limits, the cooling unit can operate in the evaporative mode, wherein each of the adiabatic mode limits and the evaporative mode limits are predetermined thresholds that determine when the system changes cooling modes.

11. The system of claim 10, wherein the cooling unit comprises a pre-cooler disposed inside the scavenger air plenum upstream of the evaporative cooler.

12. The system of claim 11, wherein the super-evaporative mode includes the pre-cooler circulating a pre-cooling fluid to selectively condition the outdoor air before passing the outdoor air through the evaporative cooler.

13. The system of claim 12, wherein on condition that the external cooling unit needs to provide more cooling to the enclosed space than is provided by the evaporative mode, the cooling unit can operate in the super-evaporating cooling mode.

14. The system of claim 1 wherein in the direct mode the outdoor air inlet and the exhaust air outlet are open, and wherein outdoor air enters the plenum and is delivered to the enclosed space as supply air.

15. The system of claim 14 wherein the direct mode includes a first direct mode in which the cooling unit is off and the outdoor air is delivered to the enclosed space without reducing a temperature of the outdoor air.

16. The system of claim 14 wherein the direct mode includes a second direct mode in which the cooling unit is on and the outdoor air passes through the coil to reduce a temperature of the outdoor air prior to delivering the outdoor air to the enclosed space.

17. The system of claim 1, wherein in the mixed mode the outdoor air inlet and an exhaust air outlet are open, and outdoor air enters the plenum and is delivered to the enclosed space as supply air, wherein the cooling unit is off, the return air inlet is open, and wherein a first portion of the return air flowing through the return air duct is exhausted to outside through the exhaust air outlet and a second portion of the return air flowing through the return duct enters the plenum at the return air inlet and mixes with the outdoor air for delivery of a mixed air stream to the enclosed space.

18. The system of claim 1 wherein the first cooling fluid and the second cooling fluid are the same and the first cooling fluid circuit is fluidly connected to the second cooling fluid circuit.

19. The system of claim 1, further comprising:
a liquid to liquid heat exchanger configured to circulate the first and second cooling fluids such that the first cooling fluid reduces a temperature of the second cooling fluid, prior to circulating the second cooling fluid through the coil.

20. A method of conditioning air for an enclosed space with a system, the method comprising:

directing air through a plenum, the air including outdoor air, return air from the enclosed space, or a combination thereof;
delivering the air from the plenum to the enclosed space as supply air;
selectively operating an external cooling unit having a first cooling fluid circuit configured to circulate a first cooling fluid, the external cooling unit located external to the plenum and the enclosed space, the external cooling unit comprising an evaporative cooler and configured to operate in a dry mode and a wet mode to reduce a temperature of the first cooling fluid;
selectively directing a second cooling fluid through a coil disposed inside the plenum to provide liquid cooling to air directed through the coil; and
selectively operating the system in one of a direct, an indirect, and a mixed mode based on an ambient temperature and humidity;
wherein:
the second cooling fluid is fluidly connected to the first cooling fluid or the second cooling fluid is cooled by the first cooling fluid prior to being directed through the coil;
the operating mode of the system determines air flow through the system and operation of the cooling unit;
the dry mode includes an economizer mode; and
the wet mode includes an adiabatic mode, an evaporative mode, and a super-evaporative mode.

21. The method of claim 20, wherein:
in the direct mode an outdoor air inlet of the plenum is open and outdoor air enters the plenum, an exhaust air outlet is open and a portion of the return air from the enclosed space is exhausted to outside;
in the indirect mode the outdoor air inlet and the exhaust air outlet are closed, the external cooling unit is on, and return air from the enclosed space is conditioned by the second cooling fluid flowing through the coil; and
in the mixed mode i the outdoor air inlet and the exhaust air outlet are each at least partially open, the external cooling unit is off and return air from the enclosed space mixes with outdoor air to create a mixed air stream that is delivered to the enclosed space as supply air.

22. The method of claim 21 further comprising:
diverting the air in the plenum through a bypass duct to bypass the coil, when the system is operating in the direct mode or mixed mode.

23. The method of claim 22 wherein diverting the air through the bypass duct includes directing the air through a bypass inlet upstream of the coil and directing the air through a bypass outlet downstream of the coil.

24. The method of claim 21 wherein the direct mode comprises a first direct mode in which the external cooling unit is off and the outdoor air is delivered to the enclosed space without reducing a temperature of the outdoor air, and wherein the direct mode comprises a second direct mode in which the external cooling unit is on and the outdoor air passes through the coil to reduce a temperature of the outdoor air prior to delivering the outdoor air to the enclosed space.

25. The method of claim 20 wherein the external cooling unit comprises a scavenger air plenum configured to receive an outdoor air stream, and wherein the evaporative cooler is disposed inside the scavenger air plenum.

26. The method of claim 25 wherein selectively operating the external cooling unit comprises:

directing the first cooling fluid through the dry coil to cool the first cooling fluid with the outdoor air stream.

27. The method of claim 25 wherein selectively operating the external cooling unit in the wet mode comprises:
   operating the external cooling unit in an adiabatic mode, wherein an evaporative cooling fluid flowing through the evaporative cooler is separate from the first cooling fluid; and
   operating the external cooling unit in an evaporative mode, wherein the first cooling fluid circulates through the evaporative cooler and the dry coil.

28. The method of claim 25, wherein the external cooling unit comprises a pre-cooler arranged in the scavenger air plenum upstream of the evaporative cooler, and wherein operating the external cooling unit in the wet mode comprises:
   directing the outdoor air stream through the pre-cooler to condition the outdoor air; and
   reducing a temperature of the first cooling fluid using the evaporative cooler and the dry coil.

* * * * *